US012610831B2

(12) United States Patent
Oosawa et al.

(10) Patent No.: US 12,610,831 B2
(45) Date of Patent: Apr. 21, 2026

(54) SEMICONDUCTOR DEVICE AND SEMICONDUCTOR MODULE

(71) Applicant: DENSO CORPORATION, Kariya-city (JP)

(72) Inventors: Seigo Oosawa, Kariya-city (JP); Yoshihiro Inutsuka, Kariya-city (JP); Takahiro Nakano, Kariya-city (JP); Yasushi Ookura, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 647 days.

(21) Appl. No.: 18/147,055

(22) Filed: Dec. 28, 2022

(65) Prior Publication Data

US 2023/0163054 A1 May 25, 2023

Related U.S. Application Data

(63) Continuation of application No. PCT/JP2021/024161, filed on Jun. 25, 2021.

(30) Foreign Application Priority Data

Jul. 10, 2020 (JP) ................................. 2020-119423

(51) Int. Cl.
| | |
|---|---|
| *H01L 23/495* | (2006.01) |
| *H01L 23/00* | (2006.01) |
| *H01L 23/31* | (2006.01) |

(52) U.S. Cl.
CPC .... *H01L 23/49568* (2013.01); *H01L 23/3135* (2013.01); *H01L 24/05* (2013.01);
(Continued)

(58) Field of Classification Search
CPC ........... H01L 23/49568; H01L 23/3135; H01L 24/05; H01L 24/48; H01L 2224/04042;
(Continued)

(56) References Cited

U.S. PATENT DOCUMENTS 6,306,680 B1 10/2001 Fillion et al.
6,703,707 B1 3/2004 Mamitsu et al.
(Continued)

FOREIGN PATENT DOCUMENTS

| JP | 2007-027308 A | 2/2007 |
|---|---|---|
| JP | 2007-201247 A | 8/2007 |
| JP | 2018-098254 A | 6/2018 |

*Primary Examiner* — Fernando L Toledo
*Assistant Examiner* — Shawn Shaw Muslim
(74) *Attorney, Agent, or Firm* — Posz Law Group, PLC

(57) ABSTRACT

A semiconductor device having a fan-out package structure includes a semiconductor element having a first electrode pad and a second electrode pad on a front surface, a sealing material covering a side surface of the semiconductor element and a redistribution layer covering the front surface of the semiconductor element and a part of the sealing material. The redistribution layer includes an insulation layer, a first redistribution wire and a second redistribution wire. At least a part of the first redistribution layer is disposed above a boundary between the side surface of the semiconductor element and the sealing material. The second redistribution wire is electrically connected to the second electrode pad, and at least has a part that extends to a position outside of a contour of the semiconductor element over the first redistribution wire. The second redistribution wire is electrically independent of the first redistribution wire.

15 Claims, 17 Drawing Sheets

(52) U.S. Cl.
CPC .... *H01L 24/48* (2013.01); *H01L 2224/04042* (2013.01); *H01L 2224/48245* (2013.01)

(58) Field of Classification Search
CPC ......... H01L 2224/48245; H01L 23/051; H01L 23/3735; H01L 23/4334; H01L 23/49531; H01L 24/06; H01L 24/13; H01L 21/568; H01L 23/49562; H01L 23/3107; H01L 24/45; H01L 2224/0603; H01L 2224/18; H01L 23/12
See application file for complete search history.

(56) References Cited

U.S. PATENT DOCUMENTS

| | | | |
|---|---|---|---|
| 8,237,259 B2 | 8/2012 | Pressel et al. | |
| 8,450,845 B2 * | 5/2013 | Ikeda | H01L 23/49562 257/E23.101 |
| 2003/0003699 A1 | 1/2003 | Matsuzaki et al. | |
| 2003/0132530 A1 | 7/2003 | Teshima et al. | |
| 2004/0070060 A1 | 4/2004 | Mamitsu et al. | |
| 2004/0070072 A1 | 4/2004 | Mamitsu et al. | |
| 2004/0089925 A1 | 5/2004 | Fukuda et al. | |
| 2004/0089940 A1 | 5/2004 | Mamitsu et al. | |
| 2004/0089941 A1 | 5/2004 | Mamitsu et al. | |
| 2004/0089942 A1 | 5/2004 | Mamitsu et al. | |
| 2004/0097082 A1 | 5/2004 | Mamitsu et al. | |
| 2005/0167821 A1 | 8/2005 | Mamitsu et al. | |
| 2014/0374837 A1 | 12/2014 | Ichikawa | |
| 2019/0131285 A1 * | 5/2019 | Kim | H01L 23/5389 |
| 2020/0020638 A1 * | 1/2020 | Heo | H01L 25/0652 |
| 2021/0118778 A1 * | 4/2021 | Blansaer | H01L 23/4334 |
| 2022/0199520 A1 * | 6/2022 | Kang | H01L 25/16 |

* cited by examiner

SEMICONDUCTOR DEVICE AND SEMICONDUCTOR MODULE

CROSS REFERENCE TO RELATED APPLICATIONS

The present application is a continuation application of International Patent Application No. PCT/JP2021/024161 filed on Jun. 25, 2021, which designated the U.S. and claims the benefit of priority from Japanese Patent Application No. 2020-119423 filed on Jul. 10, 2020. The entire disclosures of all of the above applications are incorporated herein by reference.

TECHNICAL FIELD

The present disclosure relates to a semiconductor device having a fan-out package structure and a semiconductor module including the semiconductor device.

BACKGROUND

For example, a semiconductor device having a semiconductor element and a semiconductor module of a double-sided heat dissipation structure having the semiconductor device are known. For example, a semiconductor module has a semiconductor device including a power semiconductor element, two heat sinks disposed on opposite sides of the semiconductor device, a lead terminal, and a wire connecting the semiconductor device and the lead terminal. In the semiconductor module, in order to suppress a short-circuit due to contact between the wire and the heat sink, a heat dissipation block made of a high thermal conductive material is disposed between a surface of the semiconductor device on a side to which the wire is connected and the heat sink facing the surface.

SUMMARY

The present disclosure describes a semiconductor device and a semiconductor module including the semiconductor device. According to an aspect of the present disclosure, a semiconductor device has a fan-out package structure, and includes a semiconductor element having a first electrode pad and a second electrode pad on a front surface, a sealing material covering a side surface of the semiconductor element, and a redistribution layer covering the front surface of the semiconductor element and a part of the sealing material. The redistribution layer includes an insulation layer, a first redistribution wire and a second redistribution wire. At least a part of the first redistribution wire is disposed above a boundary between the side surface of the semiconductor element and the sealing material. The second redistribution wire is electrically connected to the second electrode pad, and at least has a part that extends to a position outside of a contour of the semiconductor element over the first redistribution wire. The second redistribution wire is electrically independent of the first redistribution wire.

DETAILED DESCRIPTION

Figure 1:
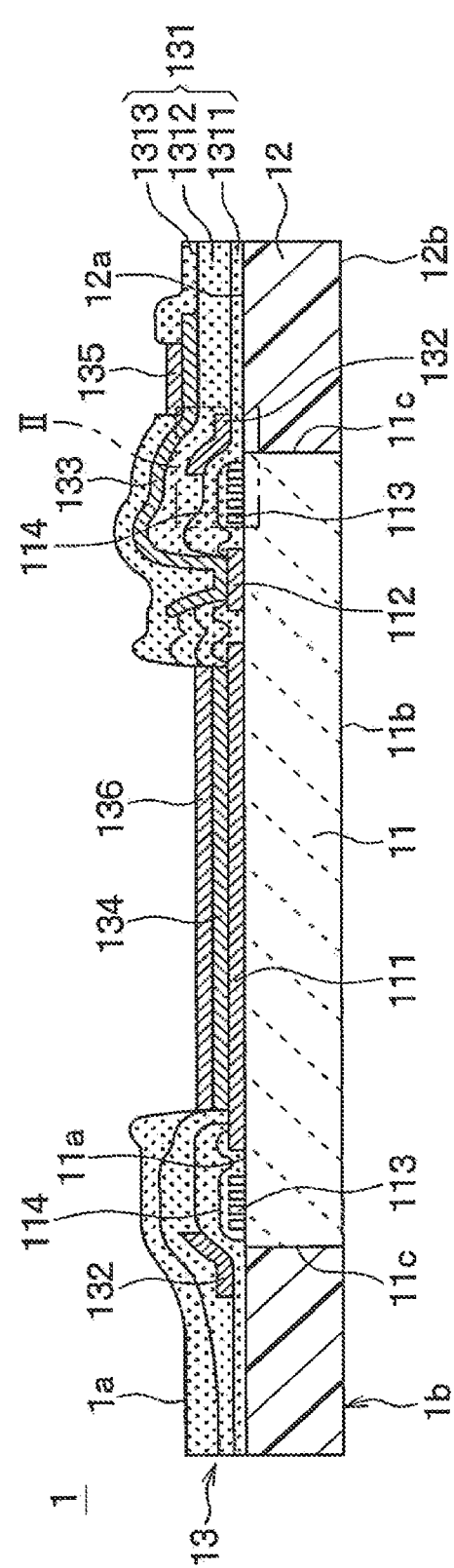
FIG. 1 is a cross-sectional view illustrating a semiconductor device according to a first embodiment.

To begin with, a relevant technology will be described as a related art only for understanding the embodiments of the present disclosure.

For example, there is a semiconductor module having a structure in which a contact between a wire and a heat sink is restricted by setting a gap between a semiconductor device and the heat sink to be equal to or greater than a predetermined value by use of a heat dissipation block. In such a semiconductor module, the heat dissipation block is an obstructive factor of reducing the thickness of the semiconductor module. Since the heat dissipation block is disposed between the semiconductor device and the heat sink, thermal resistance is likely to be increased by the heat dissipation block, and the heat dissipation of the semiconductor module is likely to be decreased.

Therefore, the inventors of the present disclosure have intensively studied the structures of the semiconductor device and the semiconductor module in order to reduce the thickness of the semiconductor module and increase the heat dissipation of the semiconductor module. As a result, the inventors have devised a semiconductor module having a structure in which a semiconductor device has a fan-out package structure having a redistribution layer formed, the heat sinks are bonded to opposite surfaces of the semiconductor device without a heat dissipation block interposed therebetween, and a lead terminal is connected to the redistribution layer without a wire interposed therebetween. Accordingly, the semiconductor module having a double-sided heat dissipation structure is obtained in which the heat dissipation block and the wire are not provided and the thickness is reduced and the heat dissipation is increased.

As a result of further intensive studies performed by the inventors of the present disclosure, it has been found that the semiconductor device having the devised fan-out package structure is reduced in thickness, a contact area between a side surface of the semiconductor element and a sealing material covering the side surface is reduced and thus the sealing material may be peeled off at the interfaces between the side surface and the sealing material. In a case where the sealing material is peeled off from the side surface of the semiconductor element, a crack extends to a portion located on a boundary between the side surface of the semiconductor element and the sealing material in an insulation layer forming the redistribution layer, and there is a possibility that insulation of a redistribution wire located on the boundary cannot be secured.

The present disclosure provides a semiconductor device having a fan-out package structure in which an insulating property of a redistribution wire above a boundary between a side surface of a semiconductor element and a sealing material is secured and the reliability is improved, and a semiconductor module having a thickness reduced and heat dissipation increased by using the semiconductor device.

According to a first aspect of the present disclosure, there is provided a semiconductor device having a fan-out package structure, the semiconductor device including: a semiconductor element that includes, on a front surface, a first electrode pad and a second electrode pad; a sealing material that is made of an insulating resin material and covers a side surface connecting the front surface of the semiconductor element with a back surface of the semiconductor element; and a redistribution layer that covers the front surface of the semiconductor element and a part of the sealing material. The redistribution layer includes an insulation layer that is made of an insulating resin material, a first redistribution wire of which at least a part is disposed above a boundary between the side surface of the semiconductor element and the sealing material, and a second redistribution wire that is electrically connected to the second electrode pad, of which at least a part extends to a position outside of a contour of the semiconductor element over the first redistribution wire, and that is electrically independent of the first redistribution wire.

Accordingly, the semiconductor device having a fan-out package structure is obtained in which a part of the first redistribution wire is disposed above the boundary between the side surface of the semiconductor element and the sealing material, and the second redistribution wire electrically independent of the first redistribution wire is disposed between the boundary and the part of the first redistribution wire. In the semiconductor device, even in a case where interfacial peeling occurs between the side surface of the semiconductor element and the sealing material from the surface side opposite to the redistribution layer and the crack is generated in a part of the insulation layer of the redistribution layer, the extension of the crack is likely to be blocked by the first redistribution wire. Therefore, the crack in the insulation layer does not reach the second redistribution wire, and thus the insulation of the second redistribution wire can be secured.

According to a second aspect of the present disclosure, there is provided a semiconductor module including a semiconductor device, a first heat dissipation member, a second heat dissipation member, a lead frame and a second sealing material. The semiconductor device includes: a semiconductor element including, on a front surface, a first electrode pad and a second electrode pad; a first sealing material made of an insulating resin material and covering a side surface connecting the front surface of the semiconductor element with a back surface of the semiconductor element; and a redistribution layer including an insulation layer made of an insulating resin material, a first redistribution wire of which at least a part is disposed above a boundary between the side surface of the semiconductor element and the first sealing material, and a second redistribution wire electrically connected to the second electrode pad, of which at least a part extends to a position outside of a contour of the semiconductor element over the first redistribution wire, and electrically independent of the first redistribution wire. The first heat dissipation member is connected to the back surface of the semiconductor device exposed from the first sealing material via a bonding material. The second heat dissipation member is electrically connected to the first electrode pad of the semiconductor device via the bonding material. The lead frame is electrically connected to the second redistribution wire of the semiconductor device via the bonding material. The second sealing material covers the semiconductor device, a part of the first heat dissipation member, a part of the second heat dissipation member, and a part of the lead frame.

According to the second aspect, the semiconductor module is obtained in which the first heat dissipation member and the second heat dissipation member are disposed to face each other with the semiconductor device according to the first aspect interposed therebetween, the first heat dissipation member and the second heat dissipation member are bonded to each other via the bonding material, and the first redistribution wire is electrically connected to the lead frame via the bonding material. In the semiconductor module, the crack in the lower portion of the second redistribution wire of the insulation layer is suppressed by providing the first redistribution wire, the reliability is improved, and the second heat dissipation member and the semiconductor device are directly bonded to each other, and thus a heat dissipation block is not necessary. Therefore, the semiconductor module has a structure with reduced thickness and increased heat dissipation.

Hereinafter, embodiments of the present disclosure will be described with reference to the drawings. In the following embodiments, the same or equivalent portions are denoted by the same reference numerals.

First Embodiment

A semiconductor device 1 according to the first embodiment will be described with reference to FIGS. 1 to 4.

Figure 2:
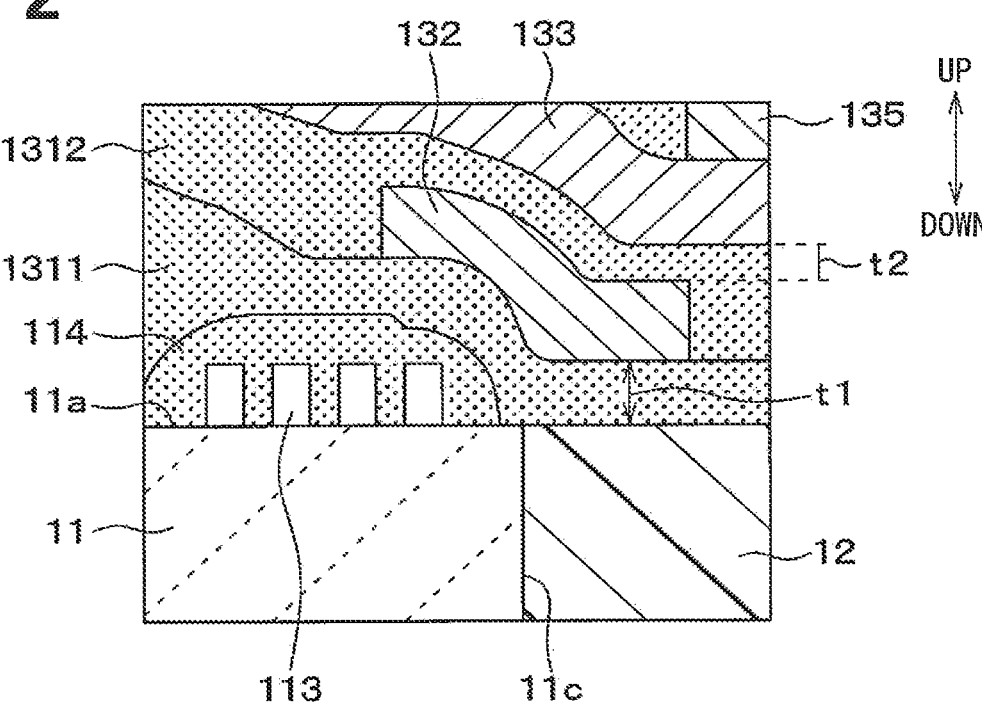
FIG. 2 is an enlarged cross-sectional view illustrating a region II of FIG. 1.
Figure 3:
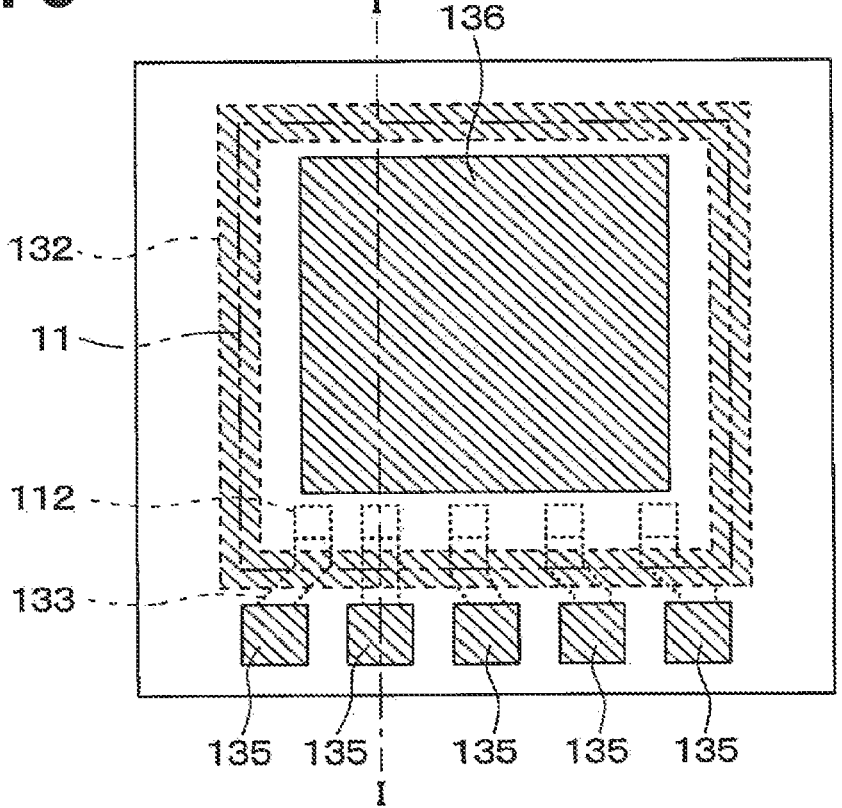
FIG. 3 is an explanatory view for explaining an arrangement relationship of a first redistribution wire and a second redistribution wire.
Figure 4:
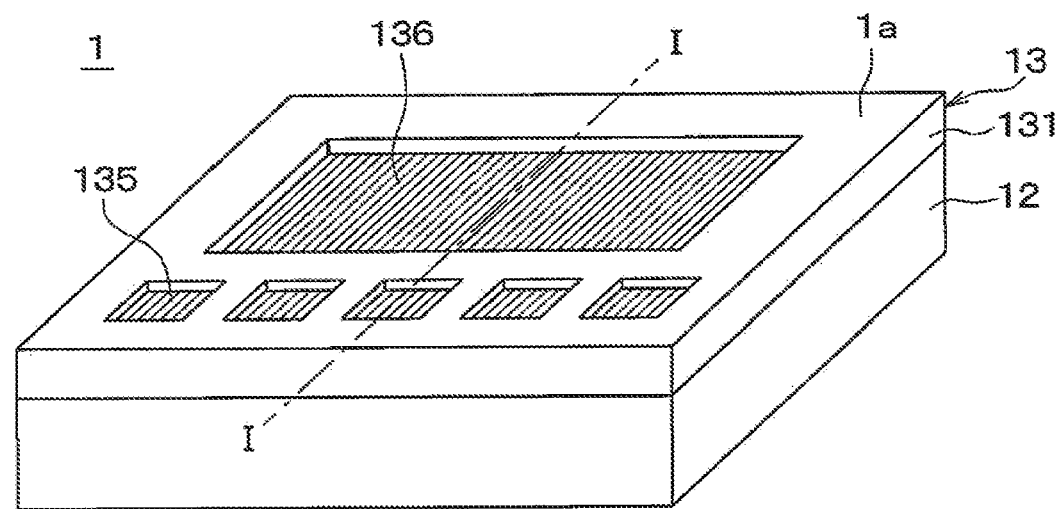
FIG. 4 is a perspective view illustrating a semiconductor device according to the first embodiment.

In FIG. 2, for convenience of explanation, a direction along a thickness direction of a semiconductor element 11 to be described later, that is, a direction from a back surface 11b toward a front surface 11a is referred to as an "upper direction", and the opposite direction is referred to as a "lower direction", and these directions are indicated by arrows. In FIG. 3, in order to facilitate understanding of an arrangement relationship of redistribution wires 132 and 133 in a redistribution layer 13 to be described later, contours of some of components covered by an insulation layer 131 in the semiconductor device 1 are indicated by a broken line. In FIG. 3, the contour of the semiconductor element 11 is indicated by a two-dot chain line in order to facilitate understanding of the arrangement of the first redistribution wire 132 with respect to the semiconductor element 11. In FIG. 4, hatching is applied to external exposed layers 135 and 136, which will be described later, but a cross-section view is not provided in order to facilitate understanding.

Configuration

As illustrated in FIG. 1, for example, the semiconductor device 1 of the present embodiment includes a semiconductor element 11 including, on a front surface 11a, electrode pads 111 and 112 and a termination structure portion 113, a sealing material 12 covering a periphery of the semiconductor element 11, and a redistribution layer 13 connected to the electrode pads 111 and 112. The redistribution layer 13 covers the front surface 11a of the semiconductor element 11 and a part of the sealing material 12, and includes the first redistribution wire 132 electrically independent of the electrode pads 111 and 112, and the second redistribution wire 133 and a third redistribution wire 134, which are connected to the electrode pads 111 and 112. The second redistribution wire 133 has one end connected to the second electrode pad 112 and the other end extending to the outside of a contour of the semiconductor element 11. That is, the semiconductor device 1 has a fan-out package structure in which a part of the redistribution wire forming the redistribution layer 13 extends to the outside of the contour of the semiconductor element 11.

For example, the semiconductor element 11 includes, on the front surface 11a, the first electrode pad 111 and a plurality of the second electrode pads 112, which are made of a metal material such as copper (Cu), the termination structure portion 113, and an on-element insulation film 114 covering the termination structure portion 113 and a part of the front surface 11a. The semiconductor element 11 is, for example, a power semiconductor element such as an insulated gate bipolar transistor (IGBT), and is manufactured by a known semiconductor process. For example, a third electrode pad (not illustrated) is formed on the back surface 11b of the semiconductor element 11, and the third electrode pad is formed to be capable of being connected to other members via a bonding material such as solder.

The first electrode pad 111 and the third electrode pad (not illustrated) form, for example, a pair of electrodes constituting an emitter electrode and a collector electrode, and serve as a current path in a direction connecting the front surface 11a and back surface 11b of the semiconductor element 11. At least one of a plurality of the second electrode pads 112 is a gate electrode, and is used to control on/off of a current between the first electrode pad 111 and the third electrode pad. As illustrated in FIG. 1, the third redistribution wire 134 is connected to the first electrode pad 111. The second redistribution wire 133 is connected to each of a plurality of the second electrode pads 112. A portion other than the back surface 11b of the semiconductor element 11 is covered by the sealing material 12.

The termination structure portion 113 is a portion formed for holding the withstand voltage of the semiconductor element 11, is formed, for example, in the vicinity of the outer end of the front surface 11a of the semiconductor element 11, and has an annular shape surrounding a predetermined region including the first electrode pad 111. The termination structure portion 113 has an arbitrary configuration in which the withstand voltage of the semiconductor element 11 can be improved by electric field relaxation such as a guard ring or a reduced surface field (Resurf), and is formed by the known semiconductor process.

The on-element insulation film 114 is made of, for example, any insulating material such as polyimide and is formed so as to cover a predetermined region including the termination structure portion 113.

As illustrated in FIG. 1, the sealing material 12 is a member that covers the side surface 11c connecting the front surface 11a of the semiconductor element 11 with the back surface 11b of the semiconductor element 11, and is made of an arbitrary insulating resin material such as epoxy resin. The contour of the sealing material 12 is located outside the contour of the semiconductor element 11 when viewed from a normal direction with respect to the front surface 11a of the semiconductor element 11. In other words, the outer shape of the sealing material 12 is larger than the outer shape of the semiconductor element 11. For example, one surface 12a of the sealing material 12, which is located on the same side as the front surface 11a of the semiconductor element 11 forms one surface together with the front surface 11a of the semiconductor element 11. On the other hand, the other surface 12b of the sealing material 12 opposite to the one surface 12a forms a back surface 1b of the semiconductor device 1 together with the back surface 11b of the semiconductor element 11.

The redistribution layer 13 includes the insulation layer 131 covering the semiconductor element 11 and a part of the sealing material 12, the first redistribution wire 132 electrically independent of the electrode pads 111 and 112, and the second redistribution wire 133 and the third redistribution wire 134 which are connected to the electrode pads 111 or 112. The redistribution layer 13 is formed by, for example, a known redistribution layer forming technique.

The redistribution layer 13 is not limited to the example of the wire illustrated in FIG. 1 as long as at least a part of the first redistribution wire 132 is disposed between the second redistribution wire 133 and a boundary portion by using a boundary between the side surface 11c of the semiconductor element 11 and the sealing material 12 as the boundary portion. For example, the redistribution layer 13 may further include a multilayer wire formed by stacking a plurality of insulation films and a plurality of redistribution wires, and may be appropriately changed.

For example, as illustrated in FIG. 1, the insulation layer 131 has a multilayer configuration in which a first layer 1311, a second layer 1312, and a third layer 1313, which are formed of an arbitrary insulating material such as polyimide are stacked. The insulation layer 131 is formed by performing, for example, a plurality times of film formation processes and a patterning process by a photolithography etching method. The insulation layer 131 has a predetermined pattern shape that covers the second redistribution wire 133 connected to the second electrode pad 112 and the third redistribution wire 134 connected to the first electrode pad 111 and exposes a part of these redistribution wires.

In the insulation layer 131, for example, as illustrated in FIG. 2, a thickness t1 of a portion of the first layer 1311 located under the first redistribution wire 132 is preferably larger than a thickness t2 of a portion of the second layer 1312 located on the first redistribution wire 132 from a viewpoint of securing the insulating property.

The redistribution wires 132 to 134 are formed of a conductive metal material containing, for example, Cu, aluminum (Al), titanium (Ti), gold (Au), silver (Ag), palladium (Pd), tungsten (W), nickel (Ni), zinc (Zn), lead (Pb), or the like as a main component. Each of the redistribution wires 132 to 134 is formed by, for example, electrolytic plating or electroless plating.

The redistribution wires 132 to 134 are not limited to the wire pattern illustrated in FIG. 1 as long as the first redistribution wire 132 is disposed between the boundary portion and a part of the second redistribution wire 133 as described above by using a boundary between the side surface 11c of the semiconductor element 11 and the sealing material 12 as the boundary portion. For example, the second redistribution wire 133 may have a multilayer configuration, and in this case, the sizes, thicknesses, and the like of the redistribution wires 132 and 134 can be appropriately changed according to the wire pattern of the second redistribution wire 133. As described above, the wire patterns, sizes, thicknesses, and the like of the redistribution wires 132 to 134 can be appropriately changed as long as the redistribution wires 132 to 134 satisfies the arrangement relationship to be described later. In the present specification, in order to distinguish the redistribution wires formed on different portions, the redistribution wires are referred to as a "first redistribution wire 132", a "second redistribution wire 133", and a "third redistribution wire 134", respectively, for convenience, but the total number of the redistribution wires and insulation layers formed in the redistribution layer 13 is not limited.

In a case where the peeling extends at the boundary between the side surface 11c of the semiconductor element 11 and the sealing material 12, and a crack is generated in a portion of the insulation layer 131 located on the boundary, the first redistribution wire 132 is provided to suppress the crack from reaching the second redistribution wire 133. For example, as illustrated in FIG. 1, at least a part of the first redistribution wire 132 is disposed above the boundary between the side surface 11c of the semiconductor element 11 and the sealing material 12 and between the boundary and the second redistribution wire 133. For example, it is preferable that the first redistribution wire 132 has a frame shape as illustrated in FIG. 3, and is disposed so as to cover the contour of the semiconductor element 11 in a top view, that is, so as to cover the entire boundary between the side surface 11c of the semiconductor element 11 and the sealing material 12, but the present disclosure is not limited to this. For example, the first redistribution wire 132 may have a shape covering only the side intersecting the second redistribution wire 133 among the sides forming the contour of the semiconductor element 11 in a top view, and even in this case, it is possible to suppress the crack in the insulation layer 131 from reaching the second redistribution wire 133.

For example, as illustrated in FIG. 1, the first redistribution wire 132 is formed on the first layer 1311 of the insulation layer 131, and is disposed with the redistribution wires 133 and 134 via a part of the insulation layer 131. That is, the first redistribution wire 132 is electrically independent of the redistribution wires 133 and 134, and the electrode pads 111 and 112.

As long as at least a part of the first redistribution wire 132 is disposed above the boundary between the side surface 11c of the semiconductor element 11 and the sealing material 12 and between the boundary and the second redistribution wire 133, the pattern shape of the first redistribution wire 132 can be appropriately changed according to the shape of the semiconductor element 11.

The second redistribution wire 133 has one end connected to the second electrode pad 112 of the semiconductor element 11 and the other end extending to the outside of the contour of the semiconductor element 11. For example, the second redistribution wire 133 is formed only as many as the second electrode pads 112, is disposed above the first redistribution wire 132 via a part of the insulation layer 131, and extends over the first redistribution wire 132. At least some of a plurality of the second redistribution wires 133 are exposed from the insulation layer 131 in a region outside the contour of the semiconductor element 11, and the exposed portion is covered by the first external exposed layer 135 formed of an arbitrary conductive material such as Ni or Au.

For example, as illustrated in FIG. 1, one end of the third redistribution wire 134 is connected to the first electrode pad 111, and the other end opposite to the one end is exposed from the sealing material 12. For example, a portion of the third redistribution wire 134 exposed from the insulation layer 131 is covered by the second external exposed layer 136 formed of an arbitrary conductive material such as Au.

For example, as illustrated in FIG. 4, the external exposed layers 135 and 136 are exposed from the insulation layer 131, and function as external electrodes that can be connected to the first electrode pad 111 and the second electrode pad 112 from the outside. The external exposed layers 135 and 136 are electrode portions exposed to the outside instead of the first electrode pad 111 or the second electrode pad 112, and can be referred to as a "first external electrode" and a "second external electrode", respectively.

The first external exposed layer 135 is disposed at a distance from the second external exposed layer 136 electrically connected to the first electrode pad 111, and has an outer shape and a plane size which are smaller than those of the second external exposed layer 136. In the example of FIG. 4, a plurality of the first external exposed layers 135 have the same outer shape and plane size and are evenly disposed, but the present disclosure is not limited to this, and a plurality of the first external exposed layers 135 may have different outer shapes and plane sizes or may be unevenly disposed.

As long as the external exposed layers 135 and 136 have a configuration in which the external exposed layers 135 and 136 are exposed to the outside of the redistribution layer 13 and can be used for connection with the outside, the external exposed layers 135 and 136 may be plated layers formed of Ni, Au, or the like, or may be bumps formed of solder or the like.

As described above, the example of the basic configuration of the semiconductor device 1 of the present embodiment has been described. The semiconductor device 1 has a fan-out package structure in which even in a case where peeling occurs between the side surface 11c of the semiconductor element 11 and the sealing material 12 and a crack is generated in the insulation layer 131 due to the peeling, the crack is suppressed by the first redistribution wire 132. Therefore, in the semiconductor device 1, as compared with a semiconductor device having a fan-out package structure of the related art, the crack in the insulation layer 131 is suppressed from extending to the second redistribution wire 133 extending from the inside of the contour of the semiconductor element 11 to the outside, and insulation of the second redistribution wire 133 can be secured. This will be described later in detail.

Manufacturing Method

Next, an example of the manufacturing method of the semiconductor device 1 of the present embodiment will be described with reference to FIGS. 5A to 5L.

Figure 5A:
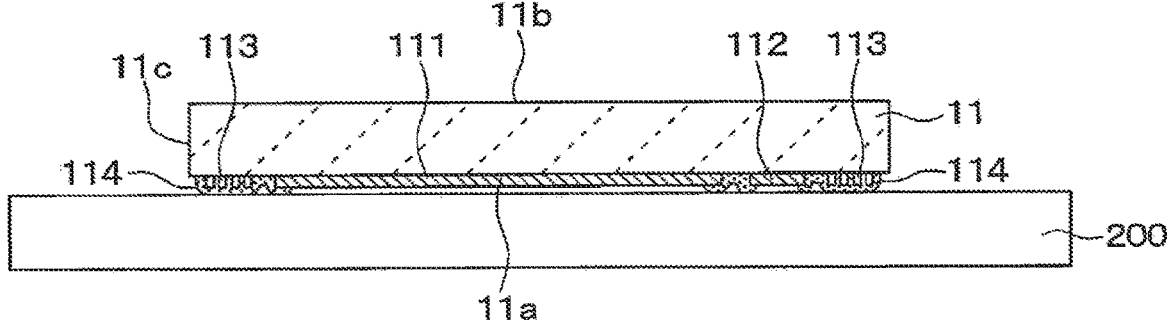
FIG. 5A is a cross-sectional view illustrating a process of attaching a semiconductor substrate to a support substrate in a manufacturing process of a semiconductor device according to the first embodiment.

First, the semiconductor element 11 is prepared which includes, on the front surface 11a of the semiconductor element 11, the first electrode pad 111, the second electrode pad 112, and the on-element insulation film 114 covering the termination structure portion 113 and the termination structure portion 113. For example, any support substrate 200 including an adhesive sheet (not illustrated) having high adhesion to silicon (Si) on the surface thereof is prepared. As illustrated in FIG. 5A, the front surface 11a side of the semiconductor element 11 is attached to the support substrate 200 to temporarily fix the semiconductor element 11.

Figure 5B:
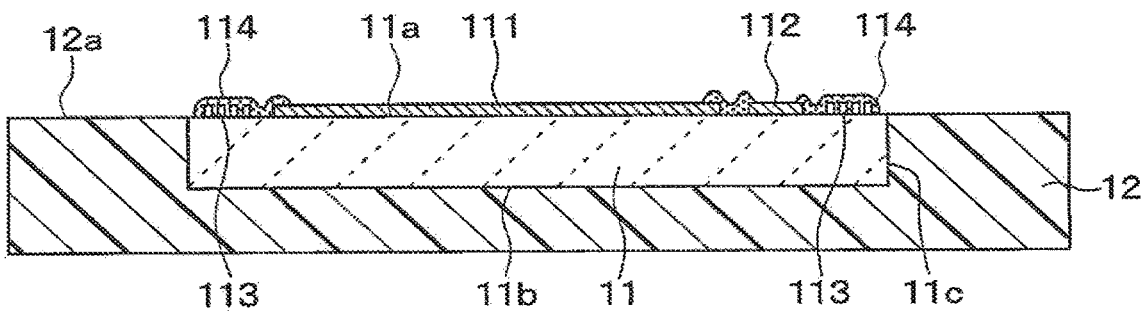
FIG. 5B is a cross-sectional view illustrating a manufacturing process of a semiconductor device subsequent to FIG. 5A.

Subsequently, a mold (not illustrated) is prepared, the semiconductor element 11 temporarily fixed to the support substrate 200 is covered with a resin material such as an epoxy resin by compression molding, and is cured by heating, and thus the sealing material 12 covering the back surface 11b and the side surface 11c of the semiconductor element 11 is molded. Thereafter, the semiconductor element 11 covered by the sealing material 12 is peeled off from the support substrate 200 by, for example, heat treatment. Accordingly, as illustrated in FIG. 5B, the back surface 11b and the side surface 11c of the semiconductor element 11 are covered by the sealing material 12, and the front surface 11a side is exposed from the sealing material 12.

Figure 5C:
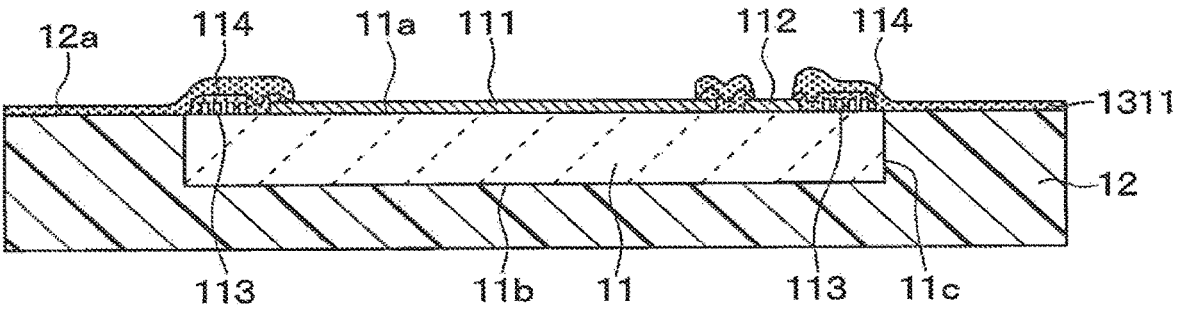
FIG. 5C is a cross-sectional view illustrating a manufacturing process of a semiconductor device subsequent to FIG. 5B.
Figure 5D:
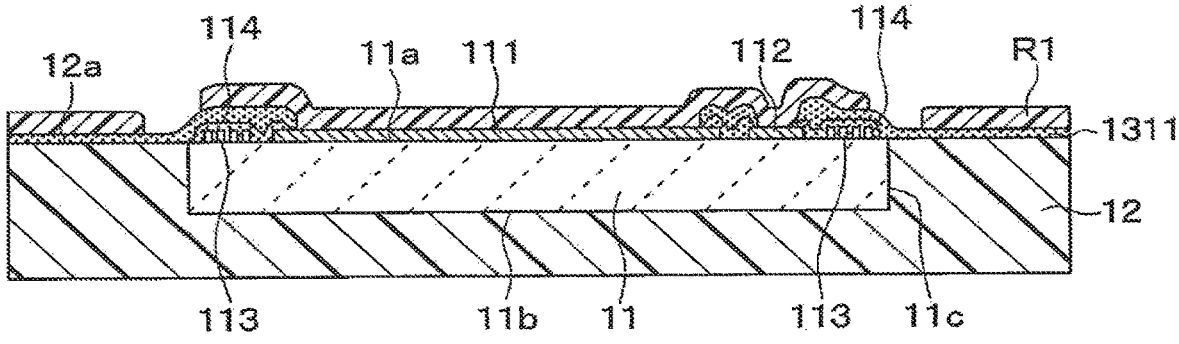
FIG. 5D is a cross-sectional view illustrating a manufacturing process of a semiconductor device subsequent to FIG. 5C.

Next, for example, a solution containing a resin material such as polyimide is applied by a spin coating method and dried to form the first layer 1311 forming a part of the insulation layer 131 as illustrated in FIG. 5C. The first layer 1311 has a predetermined pattern shape that exposes at least a part of the first electrode pad 111 and at least a part of the second electrode pad 112 of the semiconductor element 11 and covers the one surface 12a of the sealing material 12 by patterning by a photolithography etching method. For example, a seed layer (not illustrated) made of a conductive material such as Cu and covering the exposed portions of the first layer 1311 and the semiconductor element 11 is formed by vacuum film formation method such as a sputtering method. Thereafter, for example, as illustrated in FIG. 5D, a resist film R1 made of an arbitrary insulating material and having a predetermined pattern shape partially exposing the seed layer (not illustrated) is formed by a process similar to that of the first layer 1311. Accordingly, a portion which is a part of the first layer 1311 in the seed layer (not illustrated) and including at least a region located on the boundary between the side surface 11c of the semiconductor element 11 and the sealing material 12 is exposed from the resist film R1.

Figure 5E:
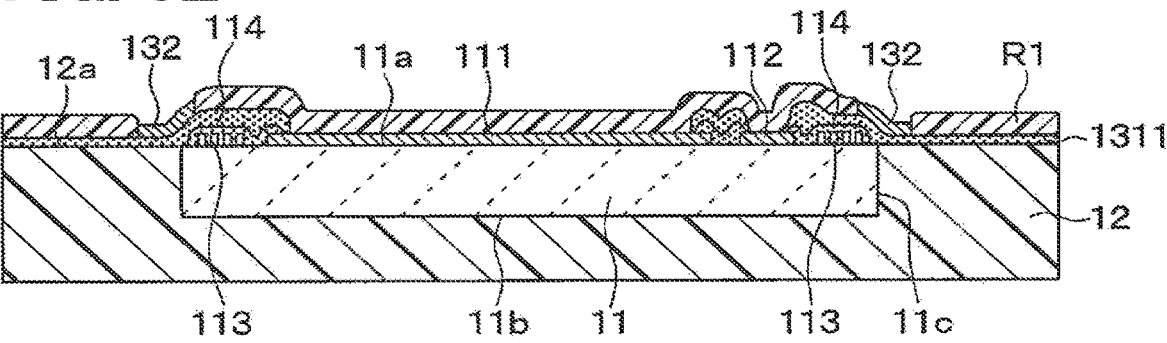
FIG. 5E is a cross-sectional view illustrating a manufacturing process of a semiconductor device subsequent to FIG. 5D.

Thereafter, as illustrated in FIG. 5E, the first redistribution wire 132 formed of a conductive material such as Cu is formed by, for example, electrolytic plating. The first redistribution wire 132 has a pattern shape in which on the first layer 1311, at least a part of the first redistribution wire 132 is disposed above the boundary between the side surface 11c of the semiconductor element 11 and the sealing material 12.

Figure 5F:
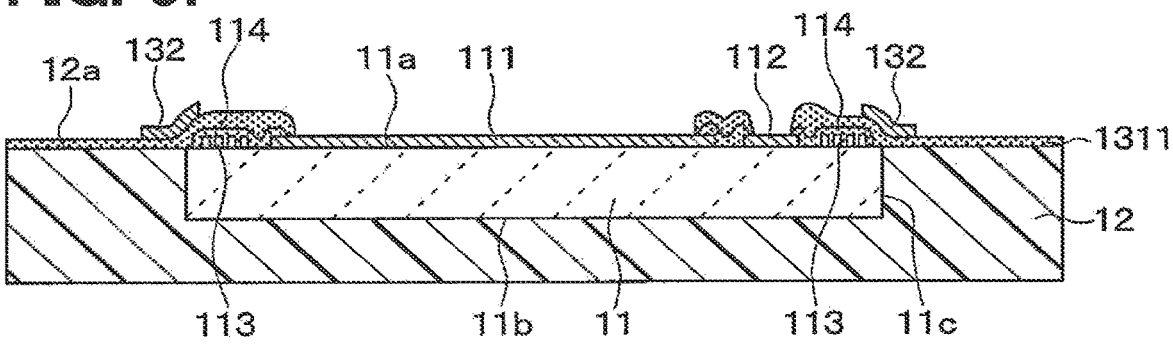
FIG. 5F is a cross-sectional view illustrating a manufacturing process of a semiconductor device subsequent to FIG. 5E.

For example, as illustrated in FIG. 5F, the resist film R1 is removed by using a peeling solution or the like, the seed layer (not illustrated) is exposed, and then a portion of the seed layer (not illustrated) exposed by the removal of the resist film R1 is removed by using an etching solution or the like. Accordingly, the seed layer (not illustrated) is removed except for the portion covered by the first redistribution wire 132, and thus a part of the first layer 1311 and the electrode pads 111 and 112 are exposed to the outside.

Figure 5G:
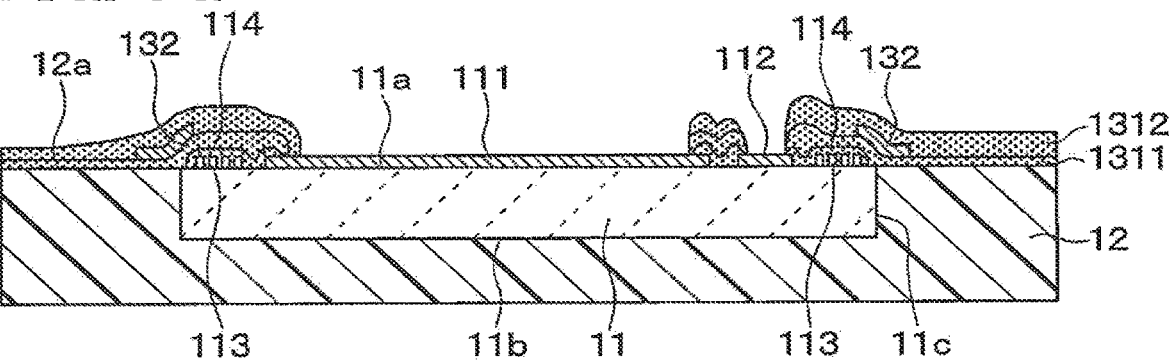
FIG. 5G is a cross-sectional view illustrating a manufacturing process of a semiconductor device subsequent to FIG. 5F.

Subsequently, for example, as illustrated in FIG. 5G, the second layer 1312 made of an arbitrary insulating resin material such as polyimide and having a predetermined pattern shape is formed by the same process as that of the first layer 1311. The second layer 1312 has a pattern shape that exposes at least a part of the electrode pads 111 and 112 and covers another region including the first redistribution wire 132.

Figure 5H:
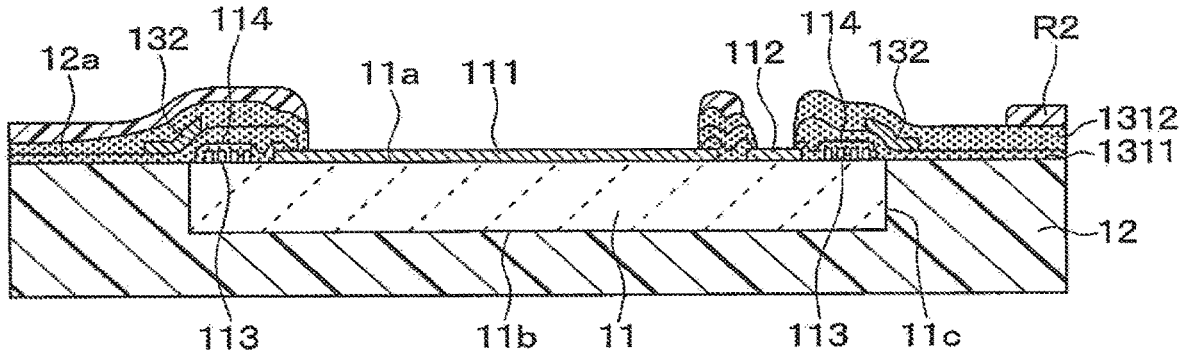
FIG. 5H is a cross-sectional view illustrating a manufacturing process of a semiconductor device subsequent to FIG. 5G.

Next, for example, the seed layer (not illustrated) made of a conductive material such as Cu and covering the exposed portions of the second layer 1312 and the electrode pads 111 and 112 is formed by vacuum film formation method such as a sputtering method. Thereafter, for example, as illustrated in FIG. 5H, a resist film R2 made of an arbitrary insulating material and having a predetermined pattern shape partially covering the second layer 1312 is formed by a process similar to that of the resist film R1. At this time, a partial region of the second layer 1312 connected to the second electrode pad 112 and the electrode pads 111 and 112 are exposed from the resist film R2.

Figures 5I, 5J, 5K, 5L:
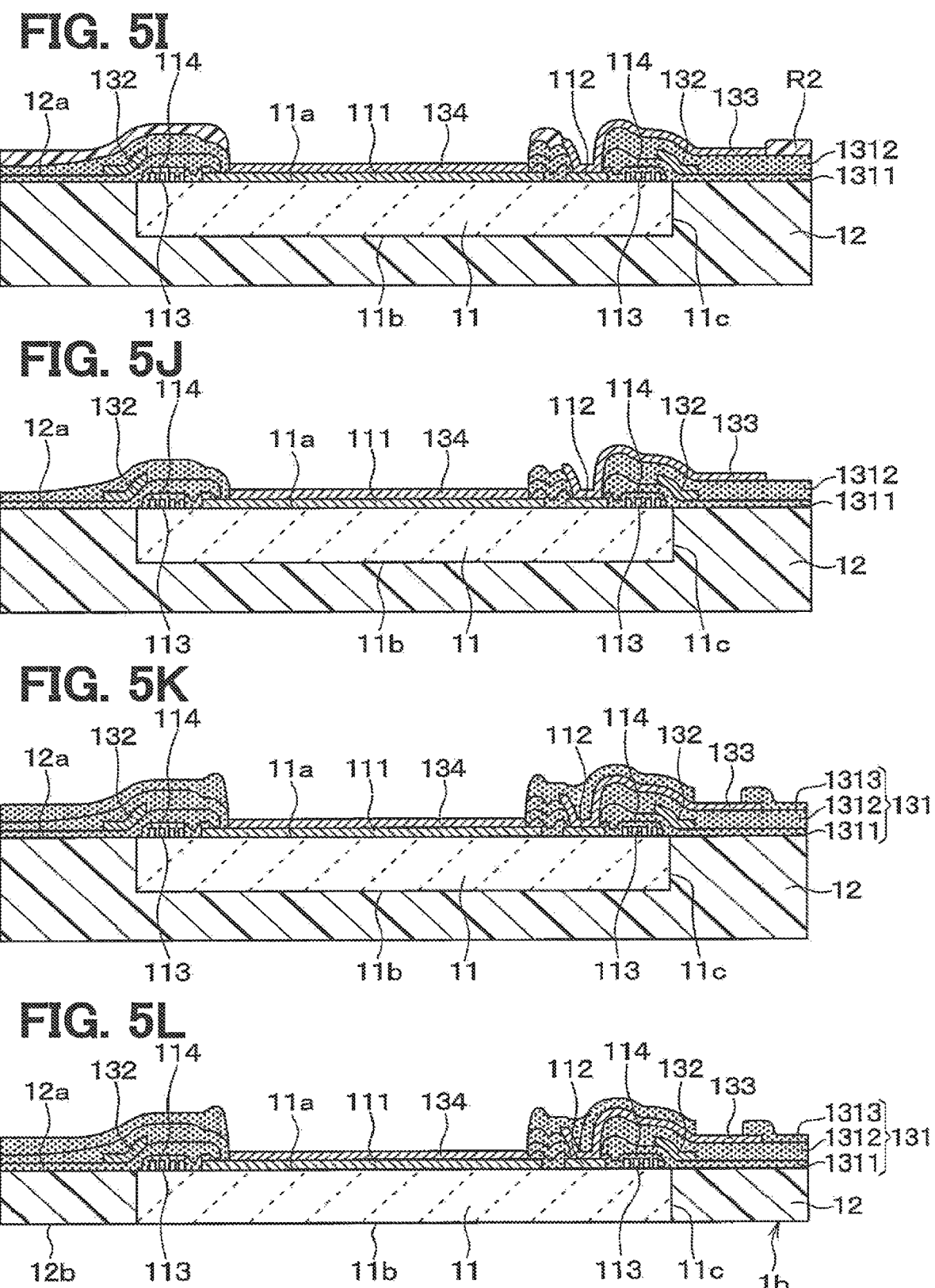
FIG. 5I is a cross-sectional view illustrating a manufacturing process of a semiconductor device subsequent to FIG. 5H.
FIG. 5J is a cross-sectional view illustrating a manufacturing process of a semiconductor device subsequent to FIG. 5I.
FIG. 5K is a cross-sectional view illustrating a manufacturing process of a semiconductor device subsequent to FIG. 5J.
FIG. 5L is a cross-sectional view illustrating a manufacturing process of a semiconductor device subsequent to FIG. 5K.

Thereafter, as illustrated in FIG. 5I, for example, the second redistribution wire 133 covering a part of the first layer 1311 and connected to the second electrode pad 112 and the third redistribution wire 134 covering at least a part of the first electrode pad 111 are formed by electrolytic plating. For example, in the case of the electrolytic plating, the redistribution wires 133 and 134 are made of a conductive metal material such as Cu.

As illustrated in FIG. 5J, the resist film R2 is removed by using the peeling solution or the like, the seed layer (not illustrated) is exposed, and then a portion of the seed layer (not illustrated) exposed by the removal of the resist film R2 is removed by using the etching solution or the like. Accordingly, the seed layer (not illustrated) is removed except for the portion covered by the redistribution wires 133 and 134, and thus a part of the second layer 1312 is exposed to the outside.

Subsequently, for example, as illustrated in FIG. 5K, the third layer 1313 made of an arbitrary insulating resin material such as polyimide and having a predetermined pattern shape is formed by the same process as that of the first layer 1311. The third layer 1313 has a pattern shape that exposes at least a part of the redistribution wires 133 and 134 and covers other regions.

Next, as illustrated in FIG. 5L, the sealing material 12 is removed from the surface covering the back surface 11b side of the semiconductor element 11, and the back surface 11b of the semiconductor element 11 is exposed from the sealing material 12. Accordingly, in the sealing material 12, the other surface 12b that is a surface opposite to the one surface 12a on the front surface 11a side of the semiconductor element 11 and forms a back surface 1b of the semiconductor device 1 with the back surface 11b of the semiconductor element 11. Thereafter, the third electrode pad (not illustrated) covering a region including the back surface 11b of the semiconductor element 11 is formed by an arbitrary vacuum film formation method such as sputtering method. The removal of the sealing material 12 may be performed by, for example, a method of grinding using a grinding tool such as a grinder (not illustrated), or may be performed by any other methods such as cutting, etching, or polishing, and is not particularly limited. The third electrode pad (not illustrated) may be formed so as to cover not only the back surface 11b of the semiconductor element 11 but also a part or the whole of the other surface 12b of the sealing material 12.

Finally, the first external exposed layer 135 covering a portion of the second redistribution wire 133 exposed from the third layer 1313 and the second external exposed layer 136 covering at least a part of the third redistribution wire 134 are formed by, for example, electroless plating.

For example, the semiconductor device 1 of the present embodiment can be manufactured by the above-described processes. In the above-described description, a case where one semiconductor device 1 is manufactured using one semiconductor element 11 has been described as a representative example, but the present disclosure is not limited to this, and it is naturally possible to collectively manufacture a plurality of the semiconductor devices 1 by using a semiconductor substrate including a plurality of the semiconductor elements 11. In a case where a plurality of the semiconductor devices 1 are collectively manufactured, other manufacturing processes are basically the same except that a dicing process is added after the formation of the external exposed layers 135 and 136.

Effect

Next, an effect obtained by using the first redistribution wire 132 disposed above the boundary between the side surface 11c of the semiconductor element 11 and the sealing material 12 will be described with reference to FIGS. 6A to 6C.

Figure 6A:
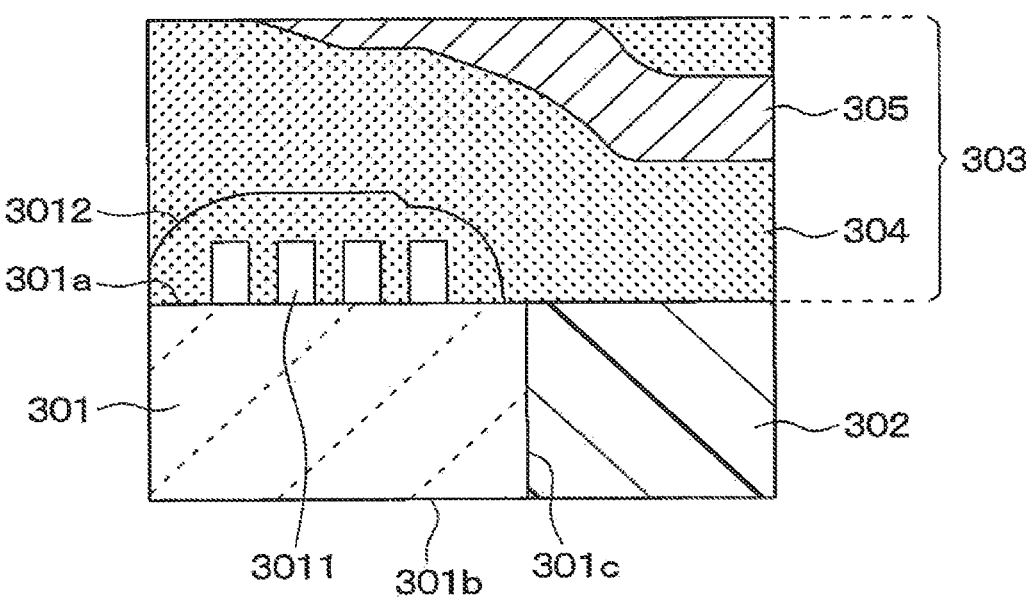
FIG. 6A is a cross-sectional view illustrating a configuration of a semiconductor device according to a comparative example.
Figure 6B:
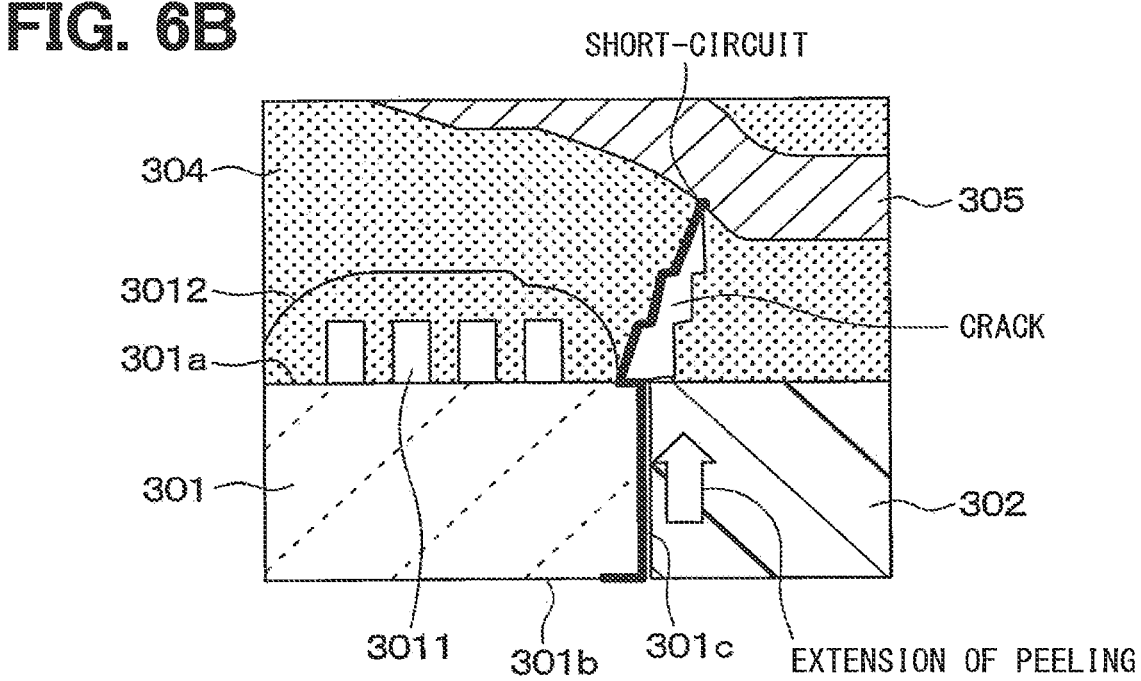
FIG. 6B is an explanatory view for explaining loss of an insulating property of a redistribution wire due to extension of peeling between the side surface of the semiconductor element and the sealing material in the semiconductor device according to the comparative example in FIG. 6A.
Figure 6C:
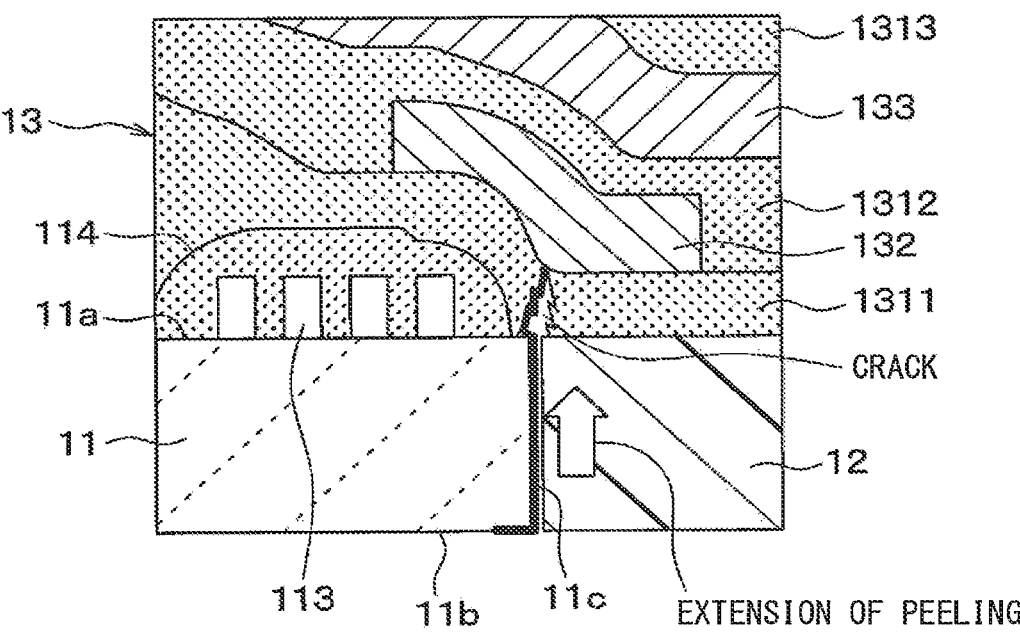
FIG. 6C is an explanatory view for explaining securing insulation of a second redistribution wire by a first redistribution wire of a semiconductor device according to the first embodiment.

FIGS. 6A to 6C are enlarged cross-sectional views illustrating the boundary between the semiconductor element and the sealing material 12 covering the side surface of the semiconductor element and a part of the redistribution layer having the redistribution wire located on the boundary. In FIGS. 6B and 6C, in order to facilitate understanding of electrical connection between a redistribution wire 305 to be described later and the back surface 11b of the semiconductor element 11, a portion where the electrical connection occurs is indicated by a thick line for convenience.

First, as a comparative example, as illustrated in FIG. 6A, a semiconductor device 300 that has a fan-out package structure including the semiconductor element 301, the sealing material 302, and a redistribution layer 303 and does not have a portion corresponding to the first redistribution wire 132 provided in the redistribution layer 303 will be described.

The semiconductor device 300 has a fan-out package structure in which the back surface 301b of the semiconductor element 301 is exposed from the sealing material 302, the side surface 301c is mainly covered by the sealing material 302, and the redistribution layer 303 partially covering the front surface 301a of the semiconductor element 301 and the sealing material 302 is provided. For example, as illustrated in FIG. 6A, the semiconductor device 300 includes a termination structure portion 3011 for holding a withstand voltage and an on-element insulation film 3012 covering the terminal structure portion 3011 in the vicinity of the contour of the front surface 301a, and the back surface 301b of the semiconductor element 301 is exposed from the sealing material 302. The sealing material 302 is in contact with the side surface 301c of the semiconductor element 301, and the contact area with the side surface 301c decreases as the semiconductor element 301 is thinned.

In the semiconductor device 300, for example, interfacial peeling between the side surface 301c of the semiconductor element 301 and the sealing material 302 may occur from the back surface 301b side toward the front surface 301a due to stress or the like caused by a linear expansion coefficient difference between the semiconductor element 301 and the sealing material 302. This interfacial peeling generates a crack in an insulation layer 304 of the redistribution layer 303 when the interface peeling further progresses toward the front surface 301a, for example, as indicated by a white arrow in FIG. 6B. When the crack generated in the insulation layer 304 further extends, the crack reaches the redistribution wire 305 disposed above the boundary between the side surface 301c of the semiconductor element 301 and the sealing material 302, and the insulating property cannot be secured due to the crack of the insulation layer 304. Specifically, when the side surface 301c of the semiconductor element 301 is not in close contact with the sealing material 302, the redistribution wire 305 is electrically connected to the back surface 301b along a surface layer of the crack of the insulation layer 304 and the side surface 301c. That is, insulation of the redistribution wire 305 cannot be secured.

On the other hand, the semiconductor device 1 of the present embodiment has a structure in which a part of the first redistribution wire 132 made of a material harder than the insulation layer 131 is disposed above the boundary between the side surface 11c of the semiconductor element 11 and the sealing material 12 and between the boundary and the second redistribution wire 133. Therefore, even when the peeling occurs between the side surface 11c of the semiconductor element 11 and the sealing material 12, and the crack is generated in a portion of the insulation layer 131 located on the boundary between the side surface 11c and the sealing material 12, the crack does not progress at the first redistribution wire 132, for example, as illustrated in FIG. 6C. Therefore, even when the crack in the insulation layer 131 is generated, the potential becomes the same as that of the back surface 11b of the semiconductor element 11 only up to the first redistribution wire 132. Accordingly, the first redistribution wire 132 suppresses the crack in the insulation layer 131 from extending to the second redistribution wire 133, and as a result, a short-circuit between the second redistribution wire 133 and the back surface 11b of the semiconductor element 11 does not occur, and the insulating property of the second redistribution wire 133 can be secured.

Configuration Example of Semiconductor Module

Figure 7:
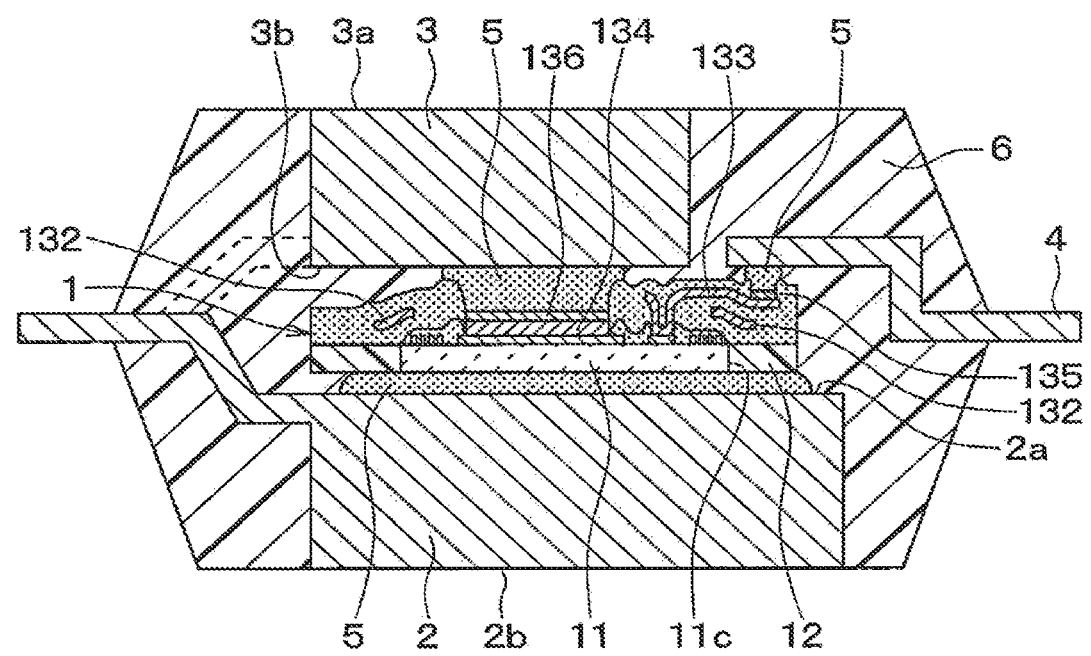
FIG. 7 is a cross-sectional view illustrating an example of a semiconductor module configured by using a semiconductor device according to the first embodiment.

Next, an example of the semiconductor module using the semiconductor device 1 of the present embodiment will be described with reference to FIG. 7. In FIG. 7, a wire portion connected to the outside in another cross section of a second heat sink 3 to be described later is indicated by a broken line.

For example, as illustrated in FIG. 7, when the semiconductor device 1 is applied to a semiconductor module having a double-sided heat dissipation structure, the semiconductor module can be thinned and increased in heat dissipation, which is preferable. In the present specification, a case where the semiconductor device 1 is applied to the semiconductor module having a double-sided heat dissipation structure will be described as a representative example, but the present disclosure is not limited to this application example.

As illustrated in FIG. 7, the semiconductor module includes the semiconductor device 1, a first heat sink 2, a second heat sink 3, a lead frame 4, a bonding material 5, and a sealing material 6. The semiconductor module has a double-sided heat dissipation structure in which two heat sinks 2 and 3 are disposed to be opposed to each other with the semiconductor device 1 interposed therebetween, and heat generated in the semiconductor device 1 is released from both surfaces to the outside through the heat sinks 2 and 3.

In the semiconductor device 1, for example, as illustrated in FIG. 7, the back surface 1b side is connected to the first heat sink 2, and the second external exposed layer 136 covering the third redistribution wire 134 on the front surface 1a side is connected to the second heat sink 3, respectively via the bonding material 5. For example, the semiconductor device 1 is disposed such that the entire region of the back surface 1b is accommodated inside the contour of an upper surface 2a of the first heat sink 2. By setting a surface of the second heat sink 3 exposed to the outside as one surface 3a, and a surface facing the semiconductor device 1 as the other surface 3b, in the semiconductor device 1, for example, at least a portion of the second redistribution wire 133, which is covered by the first external exposed layer 135, is disposed outside an contour of the other surface 3b of the second heat sink 3. The second redistribution wire 133 of the semiconductor device 1 is electrically connected to the lead frame 4 via the bonding material 5 in a region outside the contour of the second heat sink 3.

As illustrated in FIG. 7, the first heat sink 2 has a plate shape having the upper surface 2a and a lower surface 2b which have a front and back relationship, and is made of, for example, a metal material such as Cu or iron (Fe). The semiconductor device 1 is mounted on the upper surface 2a of the first heat sink 2 via the bonding material 5 formed of solder, and the lower surface 2b of the first heat sink 2 is exposed from the sealing material 6. The first heat sink 2 is, for example, a current path for applying a current to the semiconductor device 1, and a part of the first heat sink 2 on the upper surface 2a side extends to the outside of the sealing material 6. That is, in the present embodiment, the first heat sink 2 serves two roles of a heat dissipation member and a wire. The first heat sink 2 may be referred to as a "first heat dissipation member".

As illustrated in FIG. 7, the second heat sink 3 has a plate shape including the one surface 3a and the other surface 3b which have a front and back relationship, and is made of, for example, the same material as that of the first heat sink 2. The other surface 3b of the second heat sink 3 is disposed to face a part of the upper surface 2a of the semiconductor device 1, and the one surface 3a of the second heat sink 3 is exposed from the sealing material 6. The second heat sink 3 is electrically connected to the third redistribution wire 134 via the bonding material 5, and forms a current path of the semiconductor element 11 similarly to the first heat sink 2. In another cross section of FIG. 7, a part of the second heat sink 3 on the other surface 3b side extends to the outside of the sealing material 6, and serves two roles of a heat dissipation member and an electric wire. The second heat sink 3 may be referred to as a "second heat dissipation member".

The lead frame 4 is, for example, a conductive member formed of a metal material such as Cu or Fe. As illustrated in FIG. 7, the lead frame 4 is electrically connected to the first external exposed layer 135 covering a part of the second redistribution wire 133 via the bonding material 5 in an exposed region of the semiconductor device 1, which is located outside the contour of the second heat sink 3. The lead frame 4 includes, for example, a plurality of leads as many as the second electrode pads 112, and each of a plurality of the leads is electrically connected to the second redistribution wire 133.

For example, for these leads, a plurality of the adjacent leads are connected by a tie bar (not illustrated) before the formation of the sealing material 6, but after the formation of the sealing material 6, the tie bar is removed by press punching and the leads are separated. The lead frame 4 may be formed as the same member as the second heat sink 3, and may be connected by the tie bar (not illustrated) until the formation of the sealing material 6. Even in this case, the lead frame 4 is separated from the second heat sink 3 by removing the tie bar by press punching after the formation of the sealing material 6.

The bonding material 5 is a bonding material for bonding components of the semiconductor module to each other, and a conductive material, for example, a solder or a conductive resin material can be used for electrical connection.

The sealing material 6 is formed of, for example, a thermosetting resin such as an epoxy resin, and covers the semiconductor device 1, a part of the heat sinks 2 and 3, a part of the lead frame 4, and the bonding material 5 as illustrated in FIG. 7. In a case where the sealing material 12 forming a part of the semiconductor device 1 is referred to as a "first sealing material", the sealing material 6 can be referred to as a "second sealing material" that covers the semiconductor device 1.

The semiconductor module has a structure in which the second redistribution wire 133 of the semiconductor device 1 and the lead frame 4 are bonded by the bonding material 5 in a region outside the contour of the second heat sink 3. Therefore, unlike a semiconductor module in a related art, the wire connection between the semiconductor device 1 and the lead frame 4 becomes unnecessary. Since the wire is not used, it is not necessary to dispose, between the semiconductor device 1 and the second heat sink 3, a heat dissipation block for restricting contact between the wire and the second heat sink 3. Accordingly, since the thickness of the semiconductor module can be reduced by a quantity of the heat dissipation blocks, and the thermal resistance of the heat dissipation block is eliminated, the thermal resistance from the semiconductor device 1 to the second heat sink 3 is reduced.

As described above, the semiconductor module using the semiconductor device 1 does not require the wire connection between the heat dissipation block and a member, and has a structure in which the thickness and the thermal resistance are reduced as compared with the related art. The semiconductor device 1 in which the insulating property of the second redistribution wire 152 of the semiconductor device 1 is secured by the first redistribution wire 132 disposed above the boundary between the side surface 11c of the semiconductor element 11 and the sealing material 12 is used, and thus the reliability of the semiconductor module is improved.

First Modification of Semiconductor Module

Figure 8:
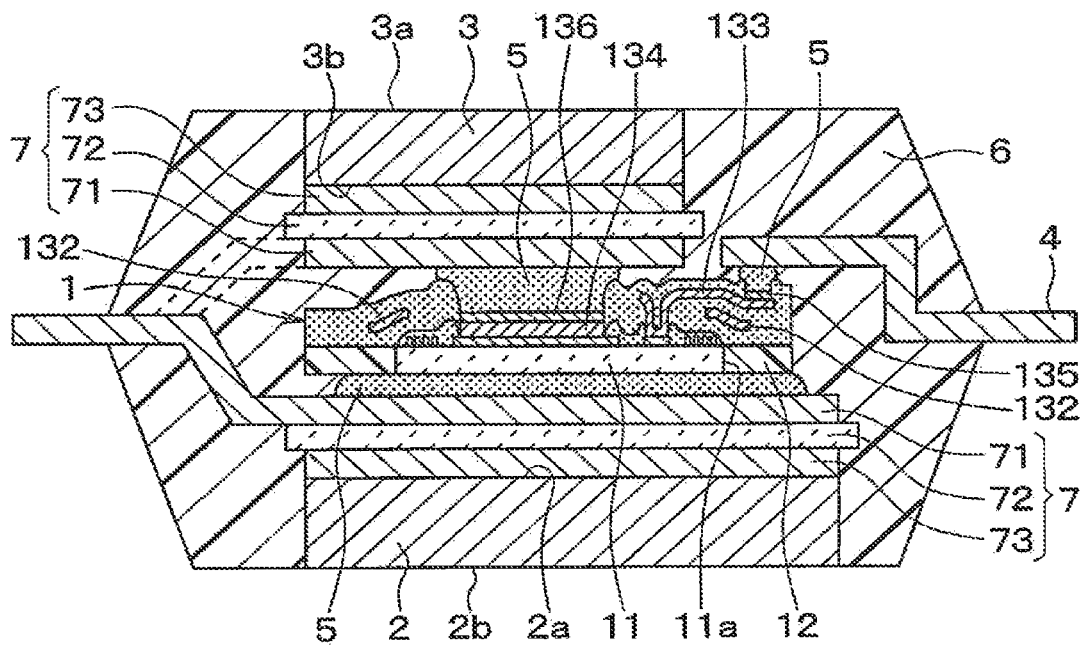
FIG. 8 is a cross-sectional view illustrating another example of a semiconductor module configured by using a semiconductor device according to the first embodiment.

All of the first and second heat dissipation members are formed by the heat sink, but the present disclosure is not limited to this. For example, as illustrated in FIG. 8, the first and second heat dissipation members may include a heat-transfer insulation substrate 7 and the heat sinks 2 and 3, and the heat-transfer insulation substrate 7 may be bonded to the semiconductor device 1.

The heat-transfer insulation substrate 7 includes an electric conduction portion 71, an insulation portion 72, and a heat conduction portion 73, these are stacked in this order, and the electric conduction portion 71 and the heat conduction portion 73 are separated by the insulation portion 72 to have an electrically independent configuration. In the heat-transfer insulation substrate 7, for example, the electric conduction portion 71 is mainly made of a metal material such as Cu, the insulation portion 72 is mainly made of an insulating material such as $Al_2O_3$ (alumina) or aluminum nitride (AlN), and the heat conduction portion 73 is mainly made of a metal material such as Cu. In the heat-transfer insulation substrate 7, the heat conduction portion 73 is bonded to the first heat sink 2 or the second heat sink 3 via the bonding material such as solder (not illustrated). As the heat-transfer insulation substrate 7, for example, a direct bonded copper (DBC) substrate can be used. In the heat-transfer insulation substrate 7, for example, a part of the electric conduction portion 71 is a wire connected to an external power supply, or is connected to another wire such as the lead frame 4, and can electrically communicate with the semiconductor element 11.

In this case, in the semiconductor module, the semiconductor device 1 and the heat sinks 2 and 3 are insulated from each other by the heat-transfer insulation substrate 7, and when the heat sinks 2 and 3 are connected to an external cooler, it is not necessary to separately interpose an insulation layer between the cooler and the semiconductor module. Therefore, the semiconductor module illustrated in FIG. 8 also has an effect of improving the reliability when connected to the external cooler.

As described above, a part of the first and second heat dissipation members, which are connected to the semiconductor device 1, may be formed by the heat-transfer insulation substrate 7, and all of the first and second heat dissipation members may be formed by the heat-transfer insulation substrate 7.

Second Modification of Semiconductor Module

In the above-described example, the first external exposed layer 135 of the semiconductor device 1 is disposed outside the contour of the second heat sink 3, and the lead frame 4 is directly bonded to the first external exposed layer 135 via the bonding material 5. However, the present disclosure is not limited to this connection structure.

Figure 9:
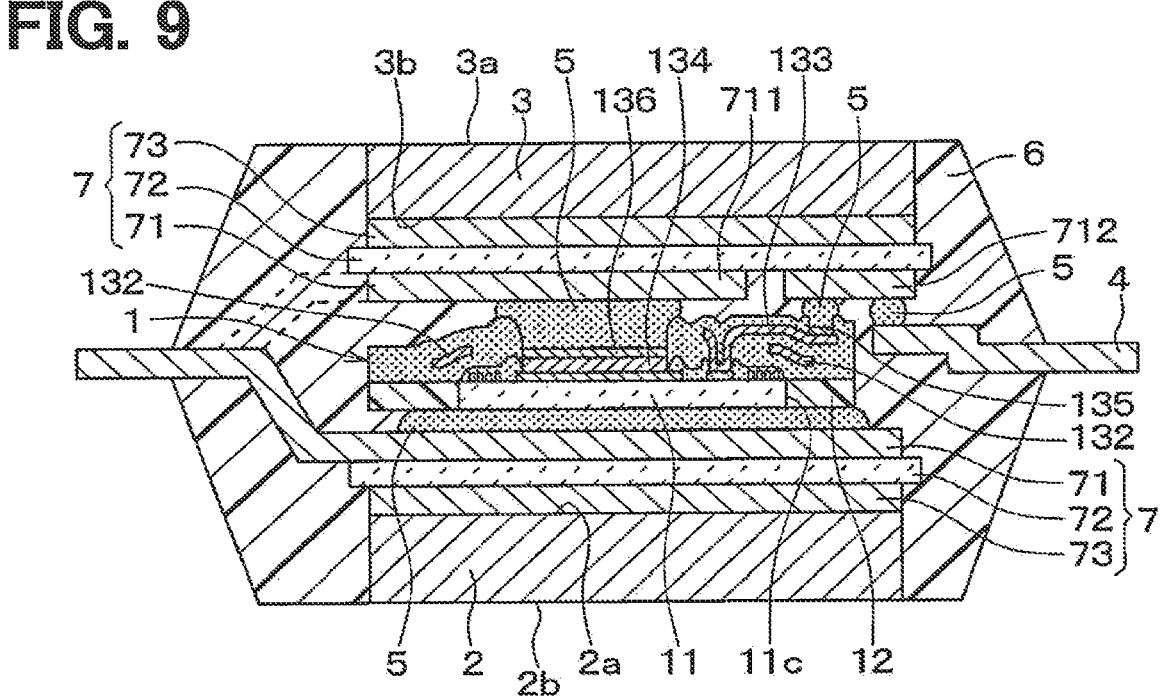
FIG. 9 is a cross-sectional view illustrating still another example of a semiconductor module configured by using a semiconductor device according to the first embodiment.

For example, in a case where a portion of the second heat dissipation member connected to the semiconductor device 1 is formed by the heat-transfer insulation substrate 7, the entire region of the semiconductor device 1 may be disposed inside the contour of the second heat dissipation member as illustrated in FIG. 9. In this case, the electric conduction portion 71 includes a first connection portion 711 connected to the second external exposed layer 136 of the semiconductor device 1 and a second connection portion 712 connected to the first external exposed layer 135, and the first connection portion 711 and the second connection portion 712 are electrically independent of each other. In the electric conduction portion 71, a part of the second connection portion 712 is disposed outside the contour of the semiconductor device 1, and the part of the second connection portion 712 is connected to the lead frame 4 via the bonding material 5.

Even with such a connection structure, the semiconductor module has a structure in which the second redistribution wire 133 of the semiconductor device 1 and the lead frame 4 are electrically connected, the heat dissipation block is not provided between the second heat dissipation member and the semiconductor device 1, and the thickness and thermal resistance are reduced as compared with the related art.

According to the present embodiment, even when the crack is generated in the insulation layer 131 due to interfacial peeling between the side surface 11c of the semiconductor element 11 and the sealing material 12, since the first redistribution wire 132 is disposed above the interface, the semiconductor device 1 in which extension of the crack is suppressed by the first redistribution wire 132 is obtained. Therefore, the crack in the insulation layer 131 does not extend to the second redistribution wire 133 disposed above the first redistribution wire 132, a short-circuit between the second redistribution wire 133 and the back surface 11b of the semiconductor element 11 is suppressed, and the insulation of the second redistribution wire 133 can be secured.

The semiconductor module is configured by using the semiconductor device 1 having the fan-out package structure, and thus it is possible to form a structure in which the heat dissipation block is not provided between the front surface 1a of the semiconductor device 1 and the heat dissipation member, and it is easy to reduce the thickness and the thermal resistance.

Modification of First Embodiment

Figure 10:
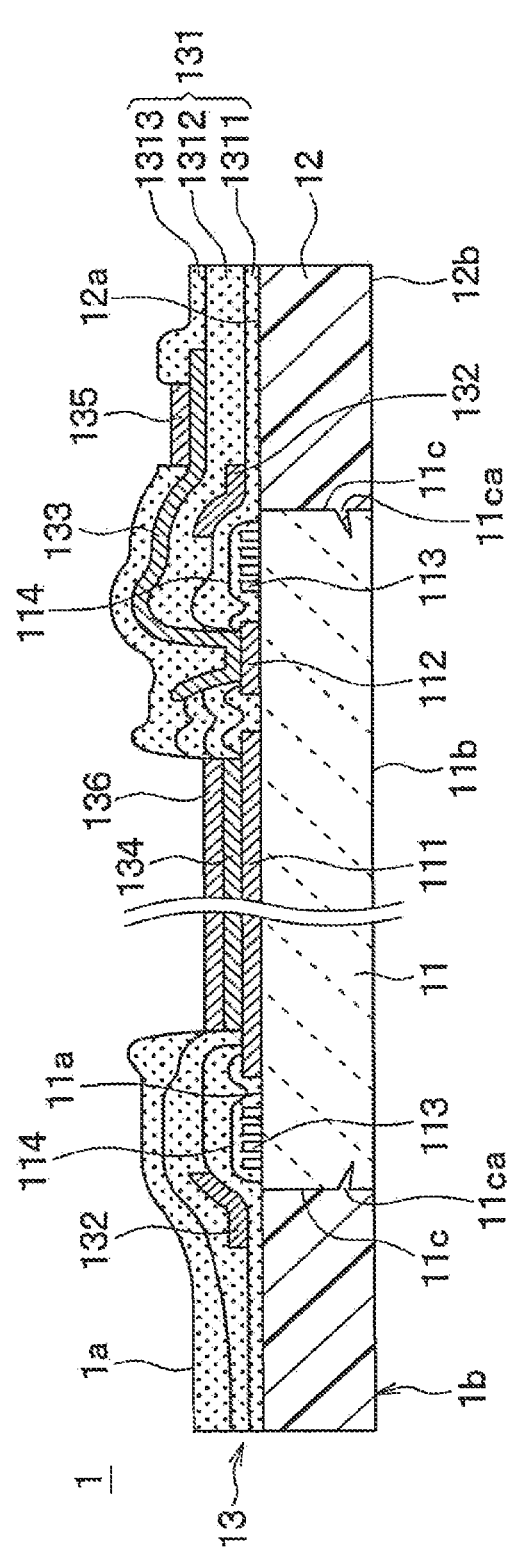
FIG. 10 is a cross-sectional view illustrating a modification of a semiconductor device according to a first embodiment.

In semiconductor element 11, for example, as illustrated in FIG. 10, uneven portion 11ca may be formed on the side surface 11c. The uneven portion 11ca has higher adhesion to the sealing material 12 than other portions of the side surface 11c due to an anchor effect. Accordingly, even in a case where the peeling occurs between the side surface 11c of the semiconductor element 11 and the sealing material 12 from the back surface 1b side of the semiconductor device 1, the extension of the peeling is suppressed in the uneven portion 11ca, and the generation of the crack in the insulation layer 131 can be suppressed.

The uneven portion 11ca can be formed by, for example, dicing a semiconductor substrate with No. 2000 blade when the semiconductor element 11 is prepared. The object described above can also be achieved by forming fine unevenness on the entire cross section by laser dicing or the like.

According to the present modification, the extension of the peeling between the side surface 11c of the semiconductor element 11 and the sealing material 12 is suppressed, and the effect of the first embodiment can be further enhanced.

Second Embodiment

A semiconductor device 1 according to the second embodiment will be described with reference to FIG. 11.

Figure 11:
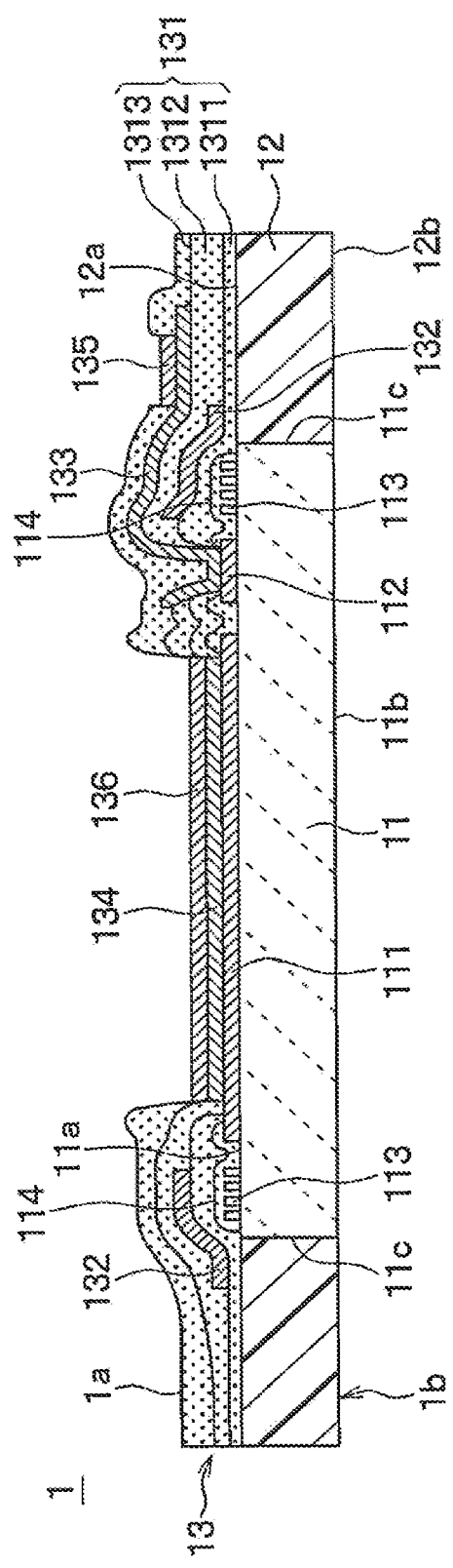
FIG. 11 is a cross-sectional view corresponding to the cross-sectional view of FIG. 1 and illustrating a semiconductor device of a second embodiment.

The semiconductor device 1 of the present embodiment is different from that of the first embodiment in that, for example, as illustrated in FIG. 11, the first redistribution wire 132 covers the entire region of the termination structure portion 113. In the present embodiment, the difference will be mainly described.

In the present embodiment, the first redistribution wire 132 has a pattern shape that covers the boundary between the side surface 11c of the semiconductor element 11 and the sealing material 12 and the termination structure portion 113. Specifically, the first redistribution wire 132 is disposed above the termination structure portion, and extends to a portion on the sealing material 12 across the boundary between the side surface 11c of semiconductor element 11 and the sealing material 12. This is because an external charge caused by moisture or the like in the air is suppressed from affecting the electric field distribution in the termination structure portion 113, and a decrease in withstand voltage of the semiconductor element 11 is suppressed.

Next, an effect of suppressing a decrease in withstand voltage obtained by covering the termination structure portion 113 with the first redistribution wire 132 will be described with reference to, for example, a comparative example illustrated in FIG. 12 in which the first redistribution wire 132 is not provided.

When the semiconductor device 1 is exposed to the outside air for a long period of time, moisture or the like in the air adheres to an outer surface, and the external charge caused by such an external environment may enter the inside from the outer surface of the insulation layer 131. As a result of studies by the present inventors, it has been found that when such an external charge reaches the termination structure portion 113, the balance of the electric field distribution in the termination structure portion 113 is lost, and the withstand voltage decreases. This is a result obtained by the present inventors calculating the change in withstand voltage property, which is caused by the external charge, by using the known simulation software for the comparative example in which the first redistribution wire 132 is not provided on the termination structure portion 113 and a practical example in which the termination structure portion 113 is covered by the first redistribution wire 132.

Figure 12:
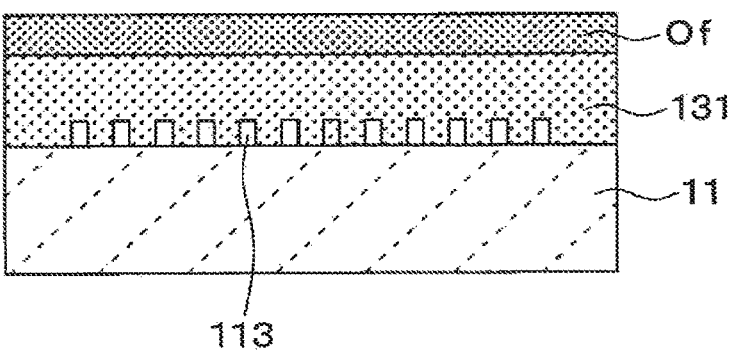
FIG. 12 is a cross-sectional view illustrating a configuration of a comparative example in simulation calculation.

Specifically, a structure illustrated in FIG. 12, that is, a structure of the semiconductor device in which the termination structure portion 113 is a guard ring, the insulation layer 131 is made of polyimide, and the first redistribution wire 132 covering the termination structure portion 113 is not provided and the insulation layer 131 is covered by an oxide film is used as a comparative example. As a structure corresponding to the semiconductor device 1 of the present embodiment, a structure in which the termination structure portion 113 is a guard ring, the insulation layer 131 is made of polyimide, and the first redistribution wire 132 covering the termination structure portion 113 is disposed in the insulation layer 131 has been described as a practical example.

Figure 13:
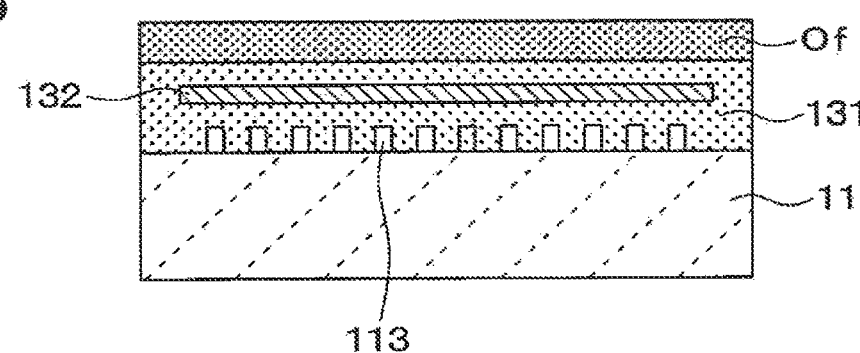
FIG. 13 is a cross-sectional view illustrating a configuration of an example in simulation calculation.

In the structure illustrated in FIG. 12, a structure in which the thickness of the insulation layer 131 is 10 μm is described as a first comparative example, a structure in which the thickness of the insulation layer 131 is 20 μm is described as a second comparative example, and in a structure illustrated in FIG. 13, a structure in which the thickness of the insulation layer 131 is 20 μm is described as a practical example.

In the simulation, for the first comparative example, the second comparative example, and the practical example, the change in withstand voltage when an external charge is applied to the entire interface between the oxide film and the insulation layer 131 is calculated. The applied electric field in this simulation is in a range of $-5\times10^{12}$ C/cm$^2$ to $1\times10^{13}$ C/cm$^2$.

Figure 14:
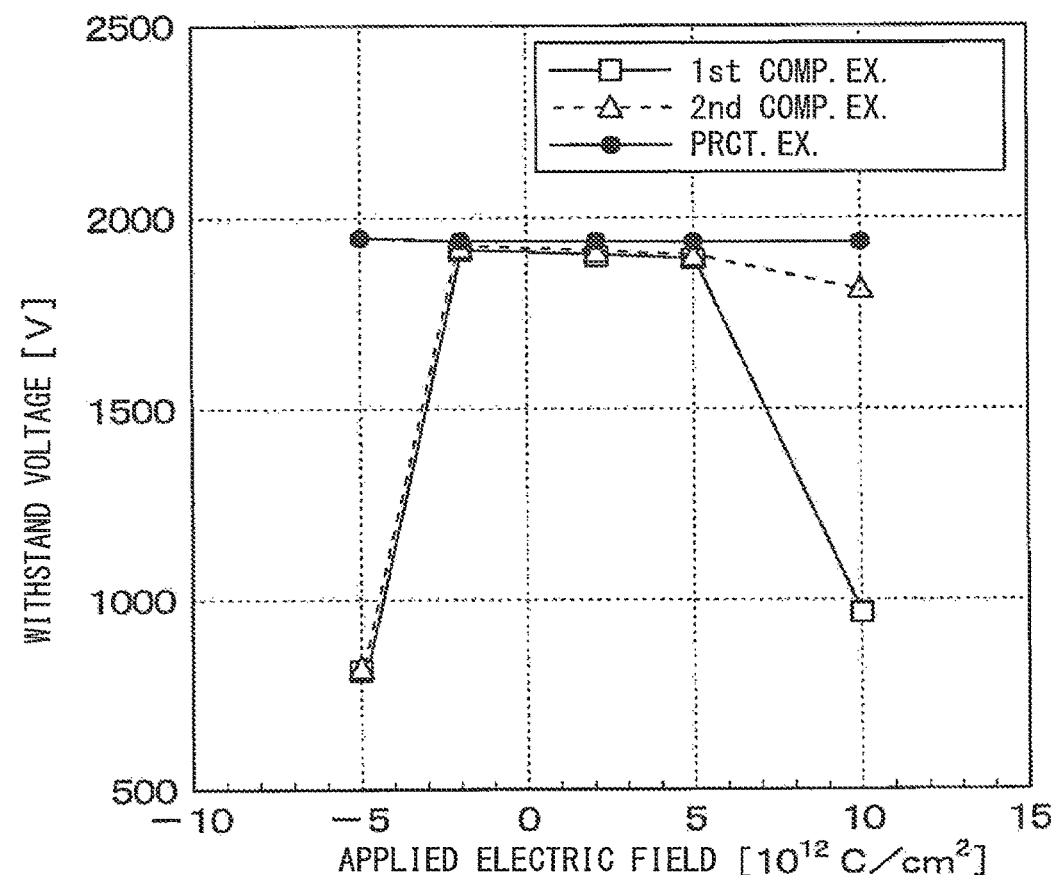
FIG. 14 is a diagram illustrating a result obtained by calculating a withstand voltage with respect to an applied electric field by simulation.

The results of the simulation are illustrated in FIG. 14.

In the first comparative example, although the withstand voltage is maintained at equal to or higher than 1900 V in a range of $-2\times10^{12}$ C/cm$^2$ to $5\times10^{12}$ C/cm$^2$, the withstand voltage is equal to or less than 900 V at $-5\times10^{12}$ C/cm$^2$, and the withstand voltage is equal to or less than 1500 V at $1\times10^{13}$ C/cm$^2$. This result indicates that the electric field distribution in the termination structure portion 113 formed by the guard ring is changed by the external charge, and the withstand voltage decreases.

In the second comparative example, although the withstand voltage is maintained at equal to or higher than 1900 V in a range of $-2\times10^{12}$ C/cm$^2$ to $5\times10^{12}$ C/cm$^2$ and the withstand voltage is maintained at about 1800 V at $1\times10^{13}$ C/cm$^2$, the withstand voltage is equal to or less than 900 V at $-5\times10^{12}$ C/cm$^2$. In the second comparative example, the thickness of the insulation layer 131 made of polyimide is increased, and thus the effect of holding the withstand voltage is slightly obtained, but is still insufficient.

On the other hand, in the practical example, the withstand voltage is equal to or higher than 1900 V in the entire range of $-5\times10^{12}$ C/cm$^2$ to $1\times10^{13}$ C/cm$^2$. This result indicates that by disposing the first redistribution wire 132 between the outer surface of the insulation layer 131 and the termination structure portion 113, the external charge having entered the insulation layer 131 is hindered by the first redistribution wire 132, and the decrease in withstand voltage is suppressed.

According to the present embodiment, the semiconductor device 1 is obtained in which the first redistribution wire 132 also serves as a shield layer for suppressing the influence from the external charge by being disposed above the termination structure portion 113 so as to cover the termination structure portion 113 and an effect of securing the insulation of the second redistribution wire 133 and holding the withstand voltage is also obtained.

Since the first redistribution wire 132 also functioning as the shield layer can be formed similarly to the second redistribution wire 133 and the third redistribution wire 134 in a process of forming the redistribution wire, it is not necessary to change the layout of the semiconductor element 11. Therefore, the structure for suppressing the decrease in withstand voltage is provided and it is possible to obtain an effect of suppressing an increase in manufacturing cost.

In the above description, the description that the decrease in withstand voltage caused by the external charge due to the adhesion of moisture or the like in the air has been made as the representative example. However, regardless of the moisture or the like in the air, when a charge exists on the surface of the insulation layer, the charge affects the electric field distribution of the termination structure portion 113, and the decrease in withstand voltage may occur even when an electric field concentration point is generated. Even in such a case, the first redistribution wire 132 covering the termination structure portion 113 functions as a shield layer, and an electric field concentration point caused by the charge on the surface of the insulation layer is suppressed from being generated, and thus an effect of suppressing the withstand voltage can be obtained.

First Modification of Second Embodiment

Figure 15:
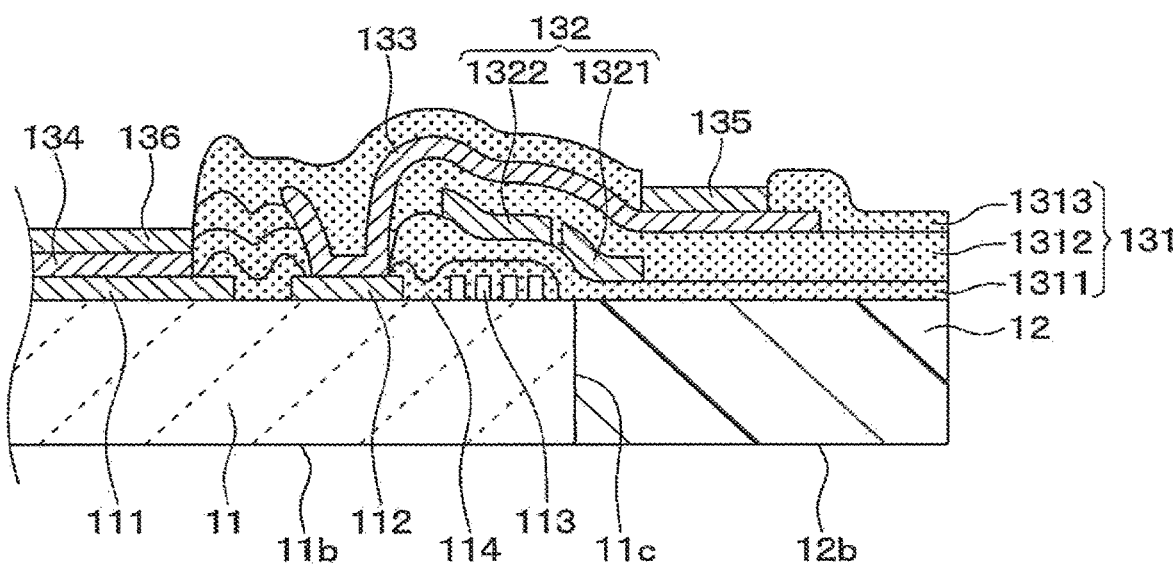
FIG. 15 is a cross-sectional view illustrating a first modification of a semiconductor device according to the second embodiment, and is a partial cross-sectional view illustrating a region in the vicinity of the first redistribution wire.

For example, as illustrated in FIG. 15, the first redistribution wire 132 may have a configuration in which a portion for securing insulation of the second redistribution wire 133 and a portion for suppressing the external charge from reaching the termination structure portion 113 are independent of each other.

Specifically, the first redistribution wire 132 may include a boundary covering portion 1321 disposed above the boundary between the side surface 11c of the semiconductor element 11 and the sealing material 12, and a termination covering portion 1322 disposed above the termination structure portion 113 so as to cover the termination structure portion 113. That is, in the first redistribution wire 132, the boundary covering portion 1321 serves a role of securing insulation of the second redistribution wire 133, and the termination covering portion 1322 serves a role of suppressing a decrease in withstand voltage.

The present modification also provides the semiconductor device 1 that can obtain the same effect as that of the second embodiment.

Second Modification of Second Embodiment

Figure 16:
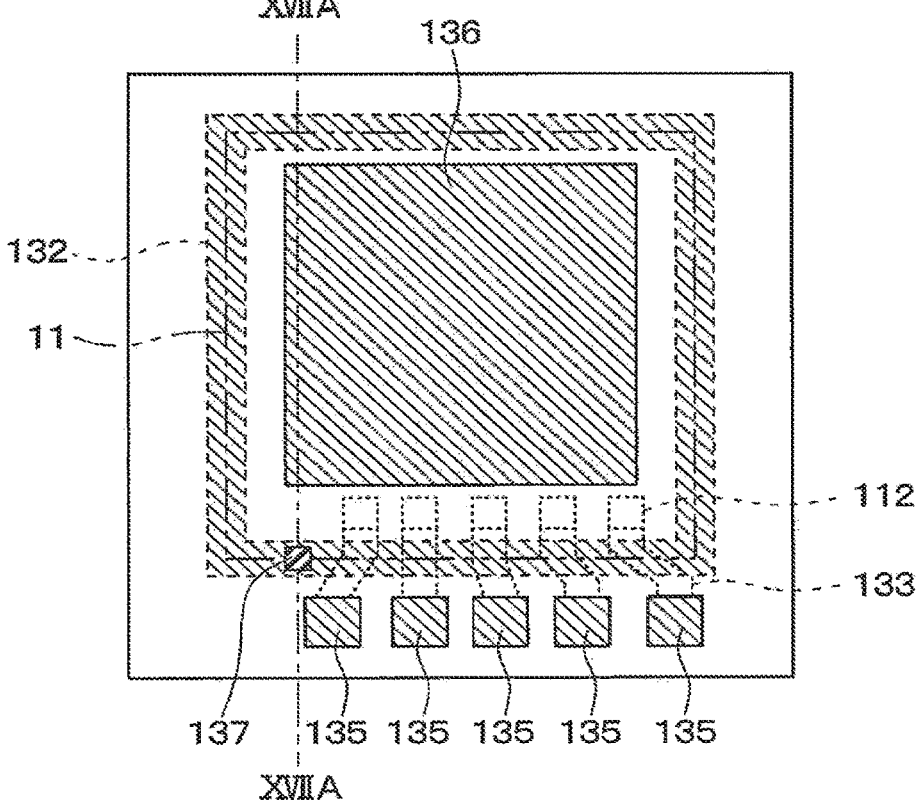
FIG. 16 is a cross-sectional view illustrating a second modification of a semiconductor device according to the second embodiment.
Figure 17A:
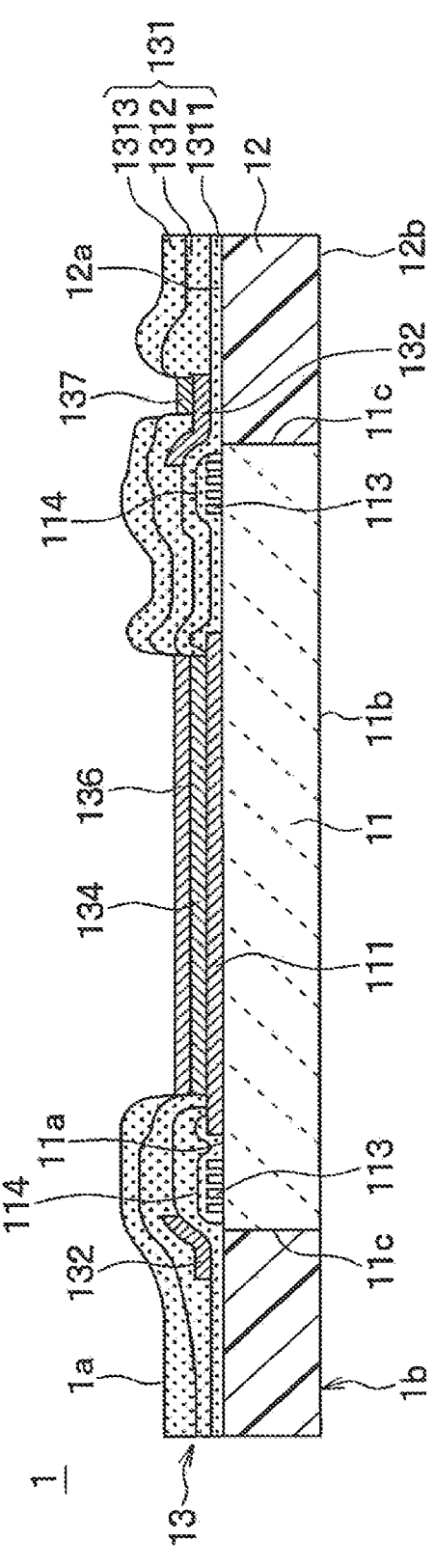
FIG. 17A is a cross-sectional view taken along line XVIIA-XVIIA in FIG. 16.

For example, as illustrated in FIG. 16, the first redistribution wire 132 may be connected to an external exposed portion 137 partially exposed from the insulation layer 131. Similarly to the external exposed layers 135 and 136, the external exposed portion 137 is made of an arbitrary conductive material such as Au or Ni, and can be formed by electrolytic plating, electroless plating, or the like. For example, as illustrated in FIG. 17A, the first redistribution wire 132 is exposed from the second layer 1312 and the third layer 1313, and the external exposed portion 137 is stacked on the exposed portion and exposed to the outside. Accordingly, even in a case where the crack in the insulation layer 131, which is caused by the interfacial peeling between the side surface 11c of the semiconductor element 11 and the sealing material 12 reaches the first redistribution wire 132, the potential of the first redistribution wire 132 can be adjusted in a predetermined range, and signal transmission in the second redistribution wire 133 can be stabilized.

Specifically, in a case where the crack in the insulation layer 131 reaches the first redistribution wire 132, the potential of the first redistribution wire 132 is the same as or approximately the same as the potential of the back surface 1b of the semiconductor device 1. At this time, when a potential difference between the first redistribution wire 132 and the second redistribution wire 133 becomes equal to or higher than a predetermined value, there is a possibility that the signal transmission in the second redistribution wire 133 is hindered.

However, since a part of the first redistribution wire 132 is connected to the external exposed portion 137 exposed from the insulation layer 131, even in a case where the crack in the insulation layer 131 reaches the first redistribution wire 132, the potential of the first redistribution wire 132 can be adjusted via the external exposed portion 137. In this case, since the potential of the first redistribution wire 132 is adjusted such that the potential difference with the second redistribution wire 133 is equal to or less than a predetermined value, hindrance of the signal transmission in the second redistribution wire 133 is suppressed and the signal transmission is stabilized.

Figure 17B:
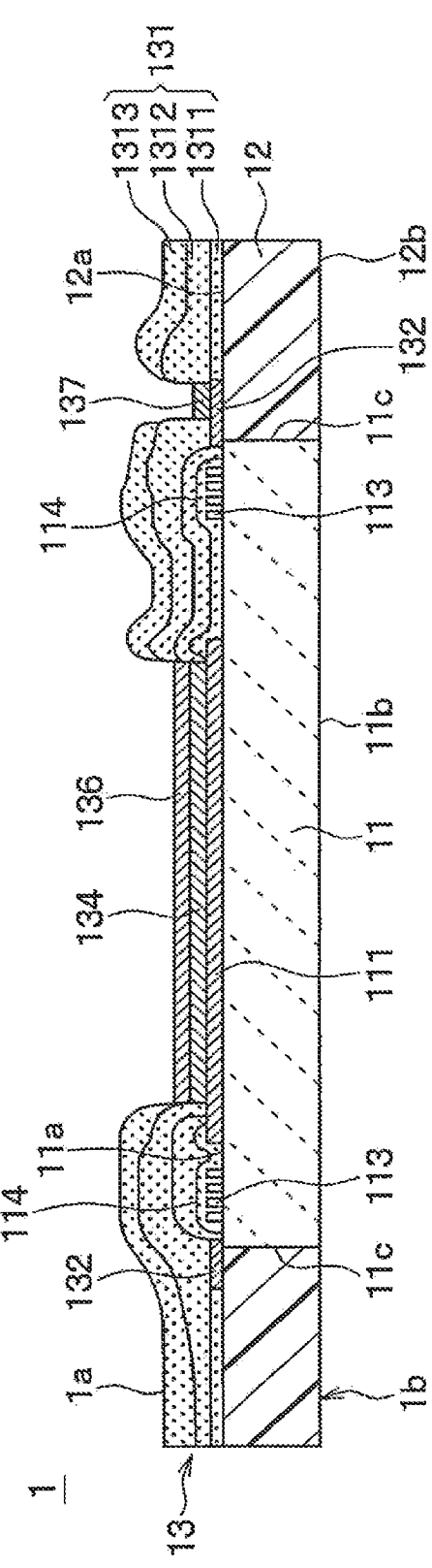
FIG. 17B is a cross-sectional view corresponding to FIG. 17A, and illustrating another arrangement example of the first redistribution wire according to the second modification of the second embodiment.

As described above, the first redistribution wire 132 is not limited to the example in which the first redistribution wire 132 is disposed above the interface between the side surface 11c of the semiconductor element 11 and the sealing material 12 via a part of the insulation layer 131. For example, as illustrated in FIG. 17B, the first redistribution wire 132 may be formed so as to directly cover an upper portion of the interface. In this case, even when the potential of the first redistribution wire 132 becomes the same as that of the back surface 1b of the semiconductor device 1, a distance to the second redistribution wire 133 increases. Therefore, the signal transmission in the second redistribution wire 133 can be further stabilized.

In the structure of the present modification, by adjusting the potential of the first redistribution wire 132, it is also possible to alleviate the influence of the external charge on the termination structure portion 113 and further suppress the decrease in withstand voltage. This is effective even in a case where the crack in the insulation layer 131 is not generated.

In a case where an initial crack is generated in the insulation layer 131 of the manufactured semiconductor device 1, the generation of the initial crack can be confirmed by measuring the potential of the first redistribution wire 132 via the external exposed portion 137. Therefore, the presence or absence of the generation of the crack in the insulating layer 131 can be confirmed by the initial inspection after manufacturing the semiconductor device 1, and an effect of easily suppressing, in advance, the defective product from being shipped is obtained.

According to the present modification, in addition to the effect of the second embodiment, it is also possible to obtain an effect of stabilizing the signal transmission in the second redistribution wire 133 even in a case where the crack in the insulation layer 131 extends to the first redistribution wire 132. Regardless of the presence or absence of the crack in the insulation layer 131, by adjusting the potential of the first redistribution wire 132, it is also possible to alleviate the influence of the external charge on the termination structure portion 113 and suppress the decrease in withstand voltage.

OTHER EMBODIMENTS

Although the present disclosure has been described in accordance with examples, it is understood that the present disclosure is not limited to the examples and configurations. The present disclosure also includes various modifications and the modifications within an equivalent range. In addition, various combinations and modes, and other combinations and modes including only one element, more elements, or less elements are also within the scope and idea of the present disclosure.

(1) For example, the first redistribution wire 132 may include the boundary covering portion 1321 and the termination covering portion 1322, and a part of the boundary covering portion 1321 may be connected to the external exposed portion 137 exposed from the insulation layer 131. In this case, the semiconductor element 11 may include the uneven portion 11*ca* on the side surface 11*c*. As described above, the above-described embodiments may be appropriately combined within a possible range.

(2) In the first embodiment, the example in which the first redistribution wire 132 is disposed above the boundary between the side surface 11*c* of the semiconductor element 11 and the sealing material 12 via a part of the insulation layer 131 has been described, but the present disclosure is not limited to this. For example, the first redistribution wire 132 may be formed so as to directly cover the boundary between the side surface 11*c* of the semiconductor element 11 and the sealing material 12 while being in contact with the front surface 11*a* of the semiconductor element 11 or the on-element insulation film 114, similarly to the second modification of the second embodiment.

(3) In the first embodiment and the modification of the first embodiment, the example in which the semiconductor element 11 includes the termination structure portion 113 has been described as the representative example, but the semiconductor element 11 may not include the termination structure portion 113.

Figure 18A:
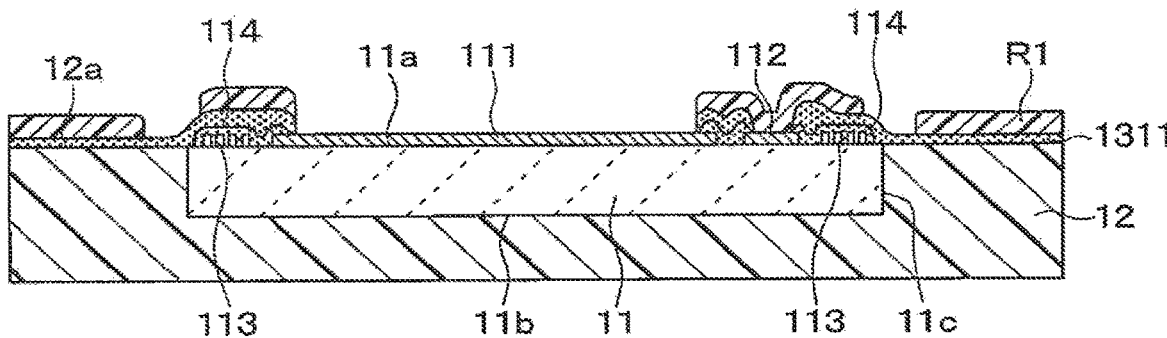
FIG. 18A is a cross-sectional view illustrating a process of forming a redistribution layer of a semiconductor device according to another embodiment.
Figure 18B:
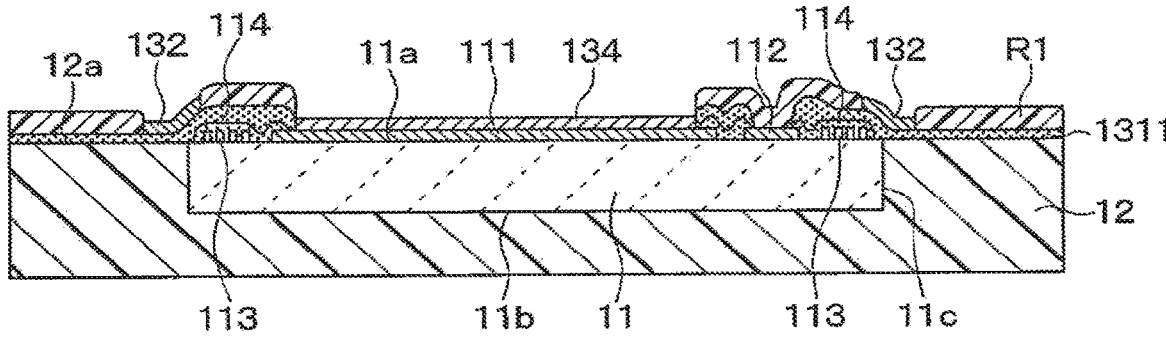
FIG. 18B is a cross-sectional view illustrating a process of forming a redistribution layer subsequent to FIG. 18A.

(4) In the first embodiment, the example in which the third redistribution wire 134 is separately formed in a process different from the process of forming the first redistribution wire 132 has been described, but the third redistribution wire 134 may be formed in the same process as the process of forming the first redistribution wire 132. For example, as illustrated in FIG. 18A, the pattern shape of the resist film R1 formed on the first layer 1311 may be changed, and as illustrated in FIG. 18B, the first redistribution wire 132 and the third redistribution wire 134 may be simultaneously formed by electrolytic plating. The same applies to the second embodiment and the modifications of the second embodiment.

Figure 18C:
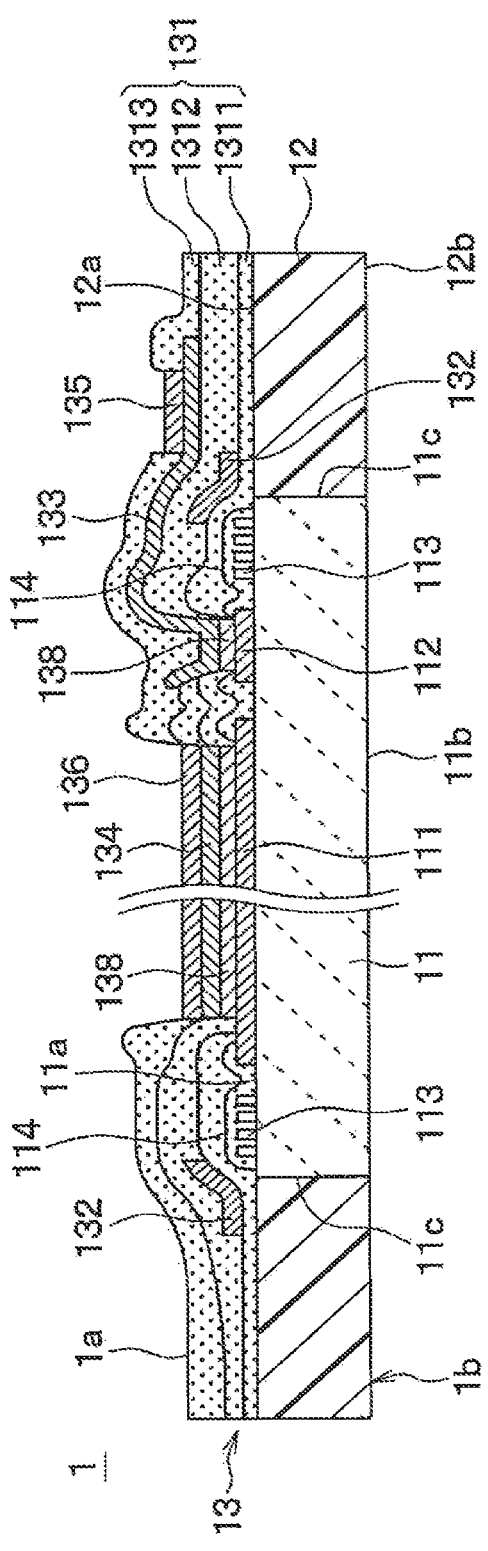
FIG. 18C is a cross-sectional view illustrating a configuration example of a redistribution layer of a semiconductor device according to another embodiment.

For example, as illustrated in FIG. 18C, the semiconductor device 1 may include an electrode layer 138 between the first electrode pad 111 and the third redistribution wire 134 and an electrode layer 138 between the second electrode pad 112 and the second redistribution wire 133. In this case, at the time of forming the first redistribution wire 132, the electrode layers 138 are formed on the electrode pads 111 and 112, respectively, and then the second redistribution wire 133 and the third redistribution wire 134 may be formed through the same processes as in the first embodiment. The same applies to the second embodiment and the modifications of the second embodiment.

What is claimed is:

1. A semiconductor device having a fan-out package structure, the semiconductor device comprising:
   a semiconductor element that includes, on a front surface, a first electrode pad and a second electrode pad;
   a sealing material that is made of an insulating resin material and covers a side surface of the semiconductor element connecting the front surface with a back surface of the semiconductor element; and
   a redistribution layer that covers the front surface of the semiconductor element and a part of the sealing material, wherein the redistribution layer includes an insulation layer made of an insulating resin material, a first redistribution wire and a second redistribution wire,
the first redistribution wire at least has a part that is disposed above a boundary between the side surface of the semiconductor element and the sealing material,
the second redistribution wire is electrically connected to the second electrode pad, and at least has a part that extends to a position outside of a contour of the semiconductor element over the first redistribution wire, and
the second redistribution wire is electrically independent of the first redistribution wire.

2. The semiconductor device according to claim 1, wherein
   the semiconductor element includes one or a plurality of the second electrode pads,
   the redistribution layer includes one or a plurality of the first redistribution wires,
   the redistribution layer further includes a third redistribution wire, a first external exposed layer and a second external exposed layer,
   the third redistribution wire is electrically connected to the first electrode pad and partially exposed from the insulation layer,
   the second redistribution wire has an exposed portion that is exposed from the insulation layer, and covered by the first external exposed layer, and
   the third redistribution wire has an exposed portion that is exposed from the insulation layer, and is covered by the second external exposed layer.

3. The semiconductor device according to claim 2, wherein
   the first external exposed layer has a plane size different from a plane size of the second external exposed layer.

4. The semiconductor device according to claim 1, wherein
   the first redistribution wire is made of a conductive material containing any one of Cu, Al, Ti, Au, Ag, Pd, W, Ni, Zn, and Pb as a main component.

5. The semiconductor device according to claim 1, wherein
   a part of the insulation layer is disposed between the first redistribution wire and the boundary.

6. The semiconductor device according to claim 1, wherein
   the semiconductor element includes an annular termination structure portion that is a portion for holding a withstand voltage of the first electrode pad, is disposed in a vicinity of a contour of the front surface, and surrounds the first electrode pad.

7. The semiconductor device according to claim 6, wherein
   the first redistribution wire is disposed above the termination structure portion and extends to a region on the sealing material over the boundary.

8. The semiconductor device according to claim 6, wherein
   the first redistribution wire includes a boundary covering portion that is a portion disposed above the boundary, and a termination covering portion that is separated from the first redistribution wire and disposed above the termination structure portion.

9. The semiconductor device according to claim 1, wherein the first redistribution wire is connected to a conductive external exposed portion partially exposed from the insulation layer.

10. The semiconductor device according to claim 1, wherein the semiconductor element has an uneven portion on the side surface.

11. The semiconductor device according to claim 1, wherein the insulation layer is provided by a plurality of layers each made of an insulating material, the plurality of layers include a first layer disposed under the first redistribution wire, and a second layer covering the first redistribution wire, a portion of the first layer located immediately under the first redistribution wire has a thickness greater than a thickness of a portion of the second layer located on the first redistribution wire.

12. A semiconductor module comprising:

a semiconductor device that includes a semiconductor element including, on a front surface, a first electrode pad and a second electrode pad, a first sealing material made of an insulating resin material and covering a side surface connecting the front surface of the semiconductor element with a back surface of the semiconductor element, and a redistribution layer including an insulation layer that is made of an insulating resin material, a first redistribution wire that at least has a part disposed above a boundary between the side surface of the semiconductor element and the first sealing material, and a second redistribution wire that is electrically connected to the second electrode pad, at least has a part extending to a position outside of a contour of the semiconductor element over the first redistribution wire, and is electrically independent of the first redistribution wire;

a first heat dissipation member that is connected to the back surface of the semiconductor element exposed from the first sealing material of the semiconductor device via a bonding material;

a second heat dissipation member that is electrically connected to the first electrode pad of the semiconductor device via the bonding material;

a lead frame that is electrically connected to the second redistribution wire of the semiconductor device via the bonding material; and a second sealing material that covers the semiconductor device, a part of the first heat dissipation member, a part of the second heat dissipation member, and a part of the lead frame.

13. The semiconductor module according to claim 12, wherein the semiconductor device has an exposed region at a part, the exposed region being located outside of a contour of the second heat dissipation member, and the lead frame is electrically connected to the second redistribution wire via the bonding material in the exposed region.

14. The semiconductor module according to claim 12, wherein the first heat dissipation member has an exposed surface exposed from the second sealing material on a side opposite to the semiconductor device, and the second heat dissipation member has an exposed surface exposed from the second sealing material on a side opposite to the semiconductor device.

15. The semiconductor module according to claim 12, wherein at least one of the first heat dissipation member and the second heat dissipation member includes a heat-transfer insulation substrate at a part or an entire part thereof, the heat-transfer insulation substrate includes an electric conduction portion, an insulation portion, and a heat conduction portion that are stacked so that the insulation portion is between the electric conduction portion and the heat conduction portion, and the electric conduction portion is connected to the semiconductor device.

* * * * *